(12) United States Patent
Diamant et al.

(10) Patent No.: US 11,775,430 B1
(45) Date of Patent: Oct. 3, 2023

(54) MEMORY ACCESS FOR MULTIPLE CIRCUIT COMPONENTS

(71) Applicant: Amazon Technologies, Inc., Seattle, WA (US)

(72) Inventors: Ron Diamant, Santa Clara, CA (US); Sundeep Amirineni, Austin, TX (US); Akshay Balasubramanian, Austin, TX (US); Eyal Freund, Austin, TX (US)

(73) Assignee: Amazon Technologies, Inc., Seattle, WA (US)

( * ) Notice: Subject to any disclaimer, the term of this patent is extended or adjusted under 35 U.S.C. 154(b) by 31 days.

(21) Appl. No.: 17/000,842

(22) Filed: Aug. 24, 2020

Related U.S. Application Data

(63) Continuation of application No. 15/919,167, filed on Mar. 12, 2018, now Pat. No. 10,768,856.

(51) Int. Cl.
*G06F 12/08* (2016.01)
*G11C 11/419* (2006.01)
(Continued)

(52) U.S. Cl.
CPC ............ *G06F 12/08* (2013.01); *G06N 3/063* (2013.01); *G11C 11/418* (2013.01); *G11C 11/419* (2013.01)

(58) Field of Classification Search
None
See application file for complete search history.

(56) References Cited

U.S. PATENT DOCUMENTS 5,574,855 A * 11/1996 Rosich ............... G06F 11/2221
714/41
5,734,859 A * 3/1998 Yorimitsu ........... G06F 11/1076
711/112
(Continued)

FOREIGN PATENT DOCUMENTS

CN 107025924 A * 8/2017 ........... G11C 11/413
EP 3153997 A2 * 4/2017 ............... G06F 1/10
(Continued)

OTHER PUBLICATIONS

Anonymous, "RAID 0 vs RAID 1", Apr. 7, 2013, pp. 1-8, https://web.archive.org/web/20130407014916/https://www.diffen.com/difference/RAID_0_vs_RAID_1 (Year: 2013).*
(Continued)

*Primary Examiner* — Christopher D Birkhimer
(74) *Attorney, Agent, or Firm* — Kilpatrick Townsend & Stockton LLP

(57) ABSTRACT

Disclosed herein are techniques for performing memory access. In one embodiment, an integrated circuit includes a port and an access engine. The integrated circuit is coupled with a memory device. The access engine is configured to: receive, from an access requester device, a request to access data stored at a memory device; and based on receiving the request: provide, via the port, a sequential access of a plurality of portions of the data to the access requester device; and access the plurality of portions of the data in a parallel form at the memory device for the access requester device. The sequential access can include a sequential write access or a sequential read access of the plurality of portions of the data.

16 Claims, 15 Drawing Sheets

(51) Int. Cl.
*G11C 11/418* (2006.01)
*G06N 3/063* (2023.01)

(56) References Cited

U.S. PATENT DOCUMENTS

| | | | | |
|---|---|---|---|---|
| 5,740,465 | A * | 4/1998 | Matsunami | G06F 3/061 |
| | | | | 710/24 |
| 5,835,940 | A * | 11/1998 | Yorimitsu | G06F 11/1076 |
| | | | | 711/112 |
| 6,678,768 | B1 * | 1/2004 | Craft | G06F 3/0605 |
| | | | | 710/100 |
| 7,130,929 | B2 * | 10/2006 | Benhase | G06F 13/387 |
| | | | | 710/10 |
| 7,130,984 | B2 * | 10/2006 | Chard | G06F 5/12 |
| | | | | 711/219 |
| 7,284,089 | B2 * | 10/2007 | Gallivan | G11C 7/16 |
| | | | | 711/115 |
| 7,313,721 | B2 * | 12/2007 | Ashmore | G06F 11/004 |
| | | | | 714/6.32 |
| 7,388,774 | B1 | 6/2008 | Kim | |
| 7,499,365 | B1 * | 3/2009 | Yu | G11C 11/412 |
| | | | | 365/207 |
| 7,542,331 | B1 | 6/2009 | Kim | |
| 7,542,332 | B1 | 6/2009 | Kim | |
| 7,617,361 | B2 * | 11/2009 | Hart | G06F 3/0619 |
| | | | | 711/114 |
| 7,719,920 | B2 * | 5/2010 | Anvar | G11C 5/025 |
| | | | | 365/233.12 |
| 7,975,168 | B2 * | 7/2011 | Morita | G06F 11/2094 |
| | | | | 714/6.22 |
| 8,266,367 | B2 * | 9/2012 | Yu | G06F 3/0608 |
| | | | | 711/103 |
| 8,397,002 | B2 * | 3/2013 | Chikusa | G06F 3/061 |
| | | | | 710/51 |
| 8,402,217 | B2 * | 3/2013 | Burd | G11C 29/52 |
| | | | | 711/114 |
| 8,514,634 | B1 * | 8/2013 | Wu | G11C 8/16 |
| | | | | 365/189.04 |
| 8,554,974 | B2 * | 10/2013 | Bailey | G06F 1/187 |
| | | | | 710/305 |
| 8,725,944 | B2 * | 5/2014 | Burd | G11C 29/52 |
| | | | | 711/114 |
| 8,977,813 | B2 * | 3/2015 | Burd | G06F 12/0246 |
| | | | | 711/114 |
| 9,015,557 | B2 * | 4/2015 | Sarcone | G06F 11/10 |
| | | | | 714/763 |
| 9,146,607 | B1 * | 9/2015 | O'Connor | G06F 9/382 |
| 9,176,883 | B2 * | 11/2015 | Yang | G06F 12/0868 |
| 9,286,174 | B2 * | 3/2016 | Murakami | G06F 3/0629 |
| 9,430,148 | B2 * | 8/2016 | Wilson | G11C 7/1072 |
| 9,442,802 | B2 * | 9/2016 | Hung | G06F 11/1076 |
| 9,448,883 | B1 * | 9/2016 | Shrader | G06F 11/1044 |
| 9,559,987 | B1 * | 1/2017 | Rangavajjhala | H04L 49/3009 |
| 9,652,343 | B2 * | 5/2017 | Klughart | G06F 3/0619 |
| 9,685,210 | B1 * | 6/2017 | Ghosh | G11C 7/1075 |
| 9,693,121 | B2 * | 6/2017 | Mobusz | H04L 67/12 |
| 9,710,168 | B2 * | 7/2017 | Motonaga | G06F 3/0629 |
| 9,760,293 | B2 * | 9/2017 | Kalwitz | G06F 3/0689 |
| 9,778,856 | B2 * | 10/2017 | Fan | G06F 3/064 |
| 9,793,944 | B2 * | 10/2017 | Fleming | H04L 1/0054 |
| 9,811,288 | B1 * | 11/2017 | Chen | G06F 3/0685 |
| 9,836,217 | B2 * | 12/2017 | Stabrawa | G06F 3/0647 |
| 9,841,901 | B1 * | 12/2017 | Armangau | G06F 3/0604 |
| 9,858,193 | B1 * | 1/2018 | Clark | G06F 12/0811 |
| 9,864,688 | B1 * | 1/2018 | O'Brien | G06F 9/46 |
| 9,870,818 | B1 * | 1/2018 | Garg | G11C 8/10 |
| 9,886,955 | B1 * | 2/2018 | Tetreault | G06F 16/90332 |
| 9,898,197 | B1 * | 2/2018 | Gao | G06F 3/0659 |
| 9,898,224 | B1 * | 2/2018 | Marshak | G06F 3/0647 |
| 9,898,350 | B2 * | 2/2018 | Alexeev | G06F 9/526 |
| 10,768,856 | B1 | 9/2020 | Diamant et al. | |
| 2003/0023781 | A1 * | 1/2003 | Benhase | H04L 29/06 |
| | | | | 710/22 |
| 2003/0033477 | A1 * | 2/2003 | Johnson | G06F 3/0601 |
| | | | | 711/114 |
| 2004/0085722 | A1 * | 5/2004 | Tanzer | G06F 1/182 |
| | | | | 361/679.31 |
| 2004/0088482 | A1 * | 5/2004 | Tanzer | G11B 33/126 |
| | | | | 711/114 |
| 2005/0073899 | A1 * | 4/2005 | Gallivan | G11C 7/16 |
| | | | | 365/232 |
| 2005/0102468 | A1 * | 5/2005 | Delaney | G06F 3/0607 |
| | | | | 711/114 |
| 2005/0243661 | A1 * | 11/2005 | Tormasi | G11B 5/09 |
| | | | | 369/13.28 |
| 2006/0107131 | A1 * | 5/2006 | Mills | G06F 11/1076 |
| | | | | 714/710 |
| 2007/0097780 | A1 * | 5/2007 | Chen | G11C 11/419 |
| | | | | 365/49.17 |
| 2007/0115731 | A1 * | 5/2007 | Hung | G06F 11/1088 |
| | | | | 365/189.05 |
| 2008/0126844 | A1 * | 5/2008 | Morita | G06F 11/1662 |
| | | | | 714/6.22 |
| 2008/0155160 | A1 * | 6/2008 | McDaniel | G06F 13/4027 |
| | | | | 710/306 |
| 2009/0013016 | A1 * | 1/2009 | Noll | G06F 21/6209 |
| 2009/0240873 | A1 * | 9/2009 | Yu | G06F 3/0608 |
| | | | | 711/103 |
| 2009/0265032 | A1 * | 10/2009 | Toscano | G11B 33/12 |
| | | | | 700/218 |
| 2010/0281208 | A1 * | 11/2010 | Yang | G06F 3/0685 |
| | | | | 711/103 |
| 2011/0066793 | A1 * | 3/2011 | Burd | G11C 29/52 |
| | | | | 711/103 |
| 2011/0270814 | A1 * | 11/2011 | Bailey | G06F 3/0632 |
| | | | | 707/706 |
| 2011/0292591 | A1 * | 12/2011 | Bailey | G06F 1/187 |
| | | | | 361/679.33 |
| 2013/0215689 | A1 * | 8/2013 | Joshi | G11C 11/419 |
| | | | | 365/189.15 |
| 2013/0227202 | A1 * | 8/2013 | Burd | G06F 11/1028 |
| | | | | 711/103 |
| 2014/0136887 | A1 * | 5/2014 | Murakami | G06F 3/0689 |
| | | | | 714/6.32 |
| 2014/0237287 | A1 * | 8/2014 | Burd | G06F 11/108 |
| | | | | 714/6.24 |
| 2014/0277590 | A1 | 9/2014 | Brown | |
| 2015/0095696 | A1 * | 4/2015 | Hess | G06F 11/108 |
| | | | | 714/6.24 |
| 2016/0055903 | A1 * | 2/2016 | Yoon | G11C 7/222 |
| | | | | 365/154 |
| 2016/0110118 | A1 * | 4/2016 | Yang | G06F 3/0611 |
| | | | | 711/103 |
| 2016/0162360 | A1 * | 6/2016 | Murakami | G06F 11/1415 |
| | | | | 714/6.23 |
| 2016/0292036 | A1 * | 10/2016 | Benhase | G06F 12/0253 |
| 2016/0309242 | A1 * | 10/2016 | Mobusz | H04Q 9/00 |
| 2017/0041041 | A1 * | 2/2017 | Fleming | H04B 1/66 |
| 2017/0075379 | A1 * | 3/2017 | Kwok | G11C 7/22 |
| 2017/0103312 | A1 * | 4/2017 | Henry | G06N 3/063 |
| 2017/0139866 | A1 * | 5/2017 | Wallace | G06F 13/4282 |
| 2017/0212692 | A1 * | 7/2017 | Camp | G06F 3/0688 |
| 2017/0262189 | A1 * | 9/2017 | Ali | G06F 3/0608 |
| 2017/0278563 | A1 * | 9/2017 | Kwok | G11C 11/419 |
| 2017/0308385 | A1 | 10/2017 | Brown | |
| 2017/0364474 | A1 | 12/2017 | Noyes et al. | |
| 2018/0218177 | A1 * | 8/2018 | Kuenemund | G09C 1/00 |
| 2020/0035303 | A1 * | 1/2020 | Tailliet | G11C 11/419 |
| 2020/0135288 | A1 * | 4/2020 | Fujiwara | G11C 7/222 |

FOREIGN PATENT DOCUMENTS

| | | | | |
|---|---|---|---|---|
| EP | | 3153998 A2 * | 4/2017 | G06F 1/10 |
| FR | | 3055735 A1 * | 3/2018 | G11C 11/419 |

(56) References Cited

FOREIGN PATENT DOCUMENTS

| JP | 2007128640 A | * | 5/2007 | ........... | G11C 11/419 |
| WO | WO-2017045720 A1 | * | 3/2017 | ........... | G11C 11/412 |
| WO | WO-2017129325 A1 | * | 8/2017 | ......... | G06F 12/0851 |

OTHER PUBLICATIONS

Anonymous, "IDE vs SATA", Nov. 27, 2011, pp. 1-8, https://web.archive.org/web/20111127035910/https://www.diffen.com/difference/IDE_vs_SATA (Year: 2011).*

Margaret Rouse, "Serial ATA (Serial Advanced Technology Attachment or SATA)", Feb. 11, 2017, pp. 1-5, https://web.archive.org/web/20170211193010/https://searchstorage.techtarget.com/definition/Serial-ATA (Year: 2017).*

Saleh Khwatreh, "RAID-based Storage Systems", International Journal of Computer Applications (0975-8887), vol. 180, No. 25, Mar. 2018, pp. 1-9 (Year: 2018).*

James Colvin, "Shift Registers", Jan. 28, 2016, pp. 1-5, https://digilent.com/blog/shift-registers/ (Year: 2016).*

Anonymous, "4 benefits of using artificial neural nets", Mar. 20, 2017, pp. 1-4, https://www.allerin.com/blog/4-benefits-of-using-artificial-neural-nets (Year: 2017).*

Sze et al., "Efficient Processing of Deep Neural Networks: a Tutorial and Survey", Aug. 13, 2017, pp. 1-32, https://arxiv.org/pdf/1703.09039.pdf (Year: 2017).*

Karrar Haider, "How to Create RAM Drives: 50x Faster Storage Solutions Than SSDs", Mar. 18, 2017, 1-14, https://web.archive.org/web/20170318173955/https://www.hongkiat.com/blog/creating-ram-drives/ (Year: 2017).*

Dogan Ibrahim, "Serial Communication", 2014, pp. 1-9, https://www.sciencedirect.com/topics/computer-science/serial-communication (Year: 2014).*

U.S. Appl. No. 15/919,167, Non-Final Office Action, dated Jan. 8, 2020, 13 pages.

U.S. Appl. No. 15/919,167, Notice of Allowance, dated May 5, 2020, 9 pages.

U.S. Appl. No. 15/919,167, filed Jan. 8, 2020, Non-Final Office Action, 13 pages.

U.S. Appl. No. 15/919,167, filed May 5, 2020, Notice of Allowance, 9 pages.

\* cited by examiner

MEMORY ACCESS FOR MULTIPLE CIRCUIT COMPONENTS

CROSS-REFERENCE TO RELATED APPLICATIONS

This application is a continuation of U.S. patent application Ser. No. 15/919,167, filed Mar. 12, 2018, granted as U.S. Pat. No. 10,768,856 on Sep. 8, 2020, entitled "MEMORY ACCESS FOR MULTIPLE CIRCUIT COMPONENTS," the full disclosure of which is incorporated herein in its entirety.

BACKGROUND

Artificial neural networks are computing systems with an architecture based on biological neural networks. Artificial neural networks can be trained, using training data, to learn about how to perform a certain computing task.

A neural network may include a set of processing nodes. Each processing node can perform computations on an input data element to generate an output data element, and the final decision can be generated based on a combination of the output data elements generated by the set of processing nodes. As part of the processing, each processing node can perform a set of arithmetic operations such as floating-point multiplications and additions to generate an intermediate output. Each processing node can also perform post-processing operations on the intermediate output to generate a final output. A neural network may be implemented by an integrated circuit with arithmetic circuitries and data paths to perform the arithmetic operations and post-processing operations, as well as memory devices to store the input data, intermediate outputs and final outputs to support the arithmetic and post-processing operations. Different components of the circuitries and data paths may access the memory devices to read the input data, to store and read the intermediate outputs, and to store the final outputs for the arithmetic operations and post-processing operations.

BRIEF DESCRIPTION OF THE DRAWINGS

Various embodiments in accordance with the present disclosure will be described with reference to the drawings, in which.

DETAILED DESCRIPTION

Figure 1:
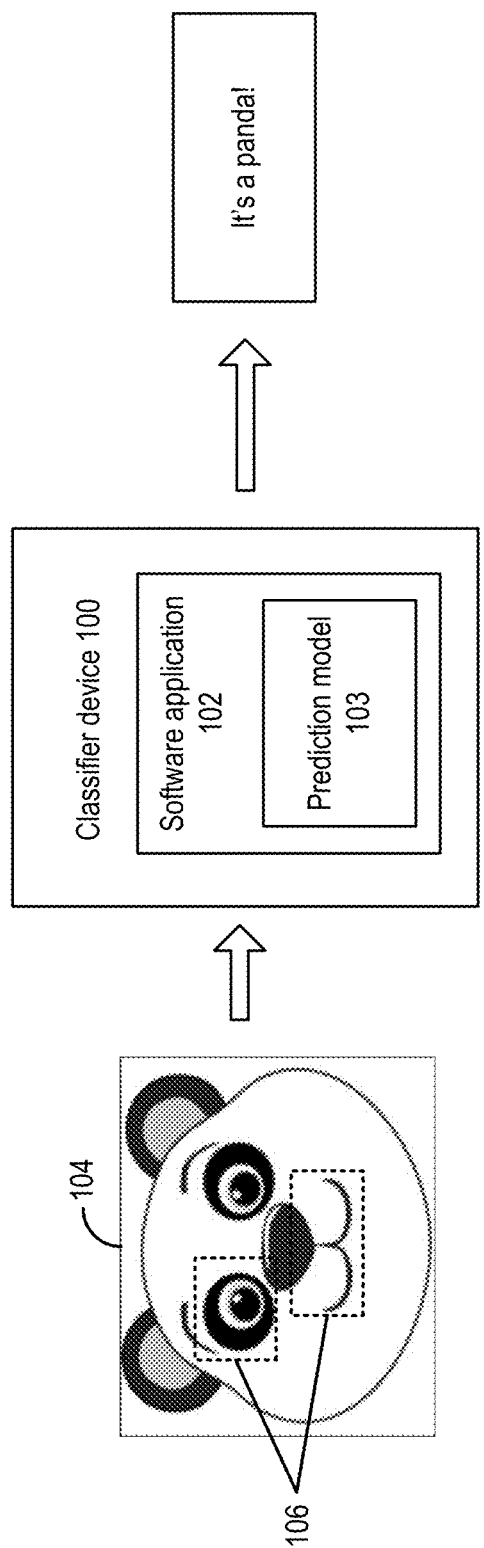
FIG. 1 illustrates an example classifier device that uses techniques disclosed herein to process data.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiments being described.

Embodiments of the present disclosure relate to a computing system for performing neural-network processing of data. More specifically, the computing system may include an access engine to provide an interface between a memory device and one or more computation components. Each of the computation components may be configured to perform a sequential access operation of data (e.g., a sequence of write operations or read operations) at the memory device. The access engine can convert the sequential access operation into a single access operation at the memory device, to reduce the operation time of the memory device and to reduce the wait time to access the memory device for each computation component, which can reduce power consumption and improve the performance of the computing system.

An artificial neural network (herein after "neural network") may include multiple processing nodes. The processing nodes can be divided into layers including, for example, an input layer, a number of intermediate layers (also known as hidden layers), and an output layer. Each processing node of one layer (e.g., an input layer, an intermediate layer, etc.) may receive a sequential stream of input data elements, multiply each input data element with a weight, compute a weighted sum of the input data elements, and forward the weighted sum to the next layer. The next layer may perform post-processing on the weighted sums. The post-processing may include a pooling operation to generate subsamples of the weighted sums to reduce the data size, applying an activation function to the subsamples, etc. to generate output data. The output layer may also compute a weighted sum of the output data, and generate a binary output (e.g., "yes" or "no") based on whether the weighted sum of the output data exceeds a threshold.

As discussed above, a neural network may be implemented by data processing circuitries and a memory device. The data processing circuitries may include, for example, a systolic array to multiply the input data elements with weights and to accumulate the multiplication products to generate a set of weighted sums. A systolic array may include an array of data processing units (DPU) connected in a network. Each DPU may perform arithmetic operations for a neural network layer. Each row of DPUs may be configured to process one input data set comprising multiple input data elements, and each DPU of the row can be configured to perform arithmetic operations on the multiple input data elements sequentially by processing one input data element at a time. For example, each DPU may include sequential processing logics that operate based on a continuous clock signal. In one clock cycle, a DPU can process a first input data element of the input data set to generate a first output. In the next clock cycle, the same DPU can process a second input data element of the input data set to generate a second output.

The memory device can provide temporary storage for the input data sets, and the memory device can also be accessed sequentially in multiple access operations, to provide each row of DPUs with one input data element (from one input data set) per access operation. The sequential accesses of the memory device (e.g., to retrieve the input data sets, storing of intermediate output data sets, storing of final output data sets, etc.) may require operating the memory device continuously for a large number of clock cycles, which can lead to huge power consumption. The sequential access operations are also undesirable in an environment where the memory device is accessed by multiple circuit components. For example, in a case where the memory device is a single-port static random access memory (SRAM) device and only allows access by one circuit component at one time, each circuit component may need to wait for the sequential access operations by another circuit component to finish before accessing the memory device, which can lead to long wait time and reduced throughput of the neural network processing. Although a multi-port SRAM device can be provided to allow concurrent access by different circuit components, such arrangements can lead to substantial increase in the physical dimension of the memory device and chip area.

Embodiments of the present disclosure relate to a computing system for performing neural-network processing of data. More specifically, the computing system may include a state buffer comprising static random access memory (SRAM) devices and configured to store input data and final output data of computations for a neural network layer. The computing system may also include an array of computing elements and a set of post-processing circuitries. The array is configured to receive the input data sequentially, whereas the set of post-processing circuitries is configured to output the final output data sequentially. The computing system further includes a read access engine configured to perform a read operation in the state buffer to obtain the input data, store the input data obtained from the state buffer in a first local buffer, and transmit the input data from the first local buffer to the array sequentially. The computing system further includes a write access engine configured to receive the final output data sequentially from the post-processing circuitries, store the final output data in a second local buffer, and perform a write operation in the state buffer to store the final output data obtained from the second local buffer.

With embodiments of the present disclosure, read and write access engines can be provided as interfaces between the memory device and each of different processing circuitries (e.g., the array of computing elements, the post-processing circuitries, etc.) of a neural network processing system. The read and write access engines can provide sequential access (e.g., sequential reads or writes) of data at the memory device for the different components. Further, the read and write access engines can also perform a single read (or write) operation to acquire (or store) the data at the memory devices. The single read/write operation can be performed in a single clock cycle. Therefore, the durations of access to the memory device can be shortened. As an illustrative example, instead of operating the memory device for 16 consecutive clock cycles to read one input data element per clock cycle for the array of computing elements (to access a total of 16 input data elements), the memory device can be operated to read the 16 input data elements in a single clock cycle. In the remaining 15 clock cycles, the memory device can be either idle, or can be operated to perform a single write operation to store 16 output data elements for the post-processing circuitries (instead of storing one output data element per clock cycle for 16 consecutive clock cycles). With such arrangements, both the power consumption of the memory device as well as the wait time to access the memory device can be reduced. As a result, the performance of the computing system can be improved.

FIG. 1 illustrates an example classifier device 100 that uses techniques disclosed herein to process data. Classifier device 100 can be, for example, a computing device operating a software application 102 and a prediction model 103 to predict information included in a data sequence, and perform a pre-determined function based on the prediction. For example, classifier device 100 can be part of an image recognition service provided to identify certain objects (e.g., texts, a person, etc.) from an image. It is understood that the image recognition service is merely provided as an illustrative example, and that techniques disclosed herein can be used for other data processing applications including, for example, text-based data processing (e.g., processing of search queries), audio data processing, etc.

The image recognition service can be provided in a multi-tenant compute service system. The multi-tenant compute service system may typically include a plurality of servers that can host data and can be used by multiple clients or organizations to run instances, such as virtual machine instances or bare-metal instances (e.g., operating systems that run directly on the server hardware). In most cases, instances, such as bare-metal or virtual machine instances, in a multi-tenant compute service system, may be allocated to a client when the client needs them and decommissioned when they are no longer needed, such that the resources can be reallocated to other clients. In the present disclosure, the terms "tenant," "client," and "customer" may be used interchangeably, although such terms do not necessarily imply the existence of any particular business arrangement. The term "instance" may refer to, for example, an instance that is executed directly on server hardware or as a virtual machine. Different types of instances generally correspond to different hardware functions and/or arrangements of hardware (e.g., different amounts of available memory and/or processing hardware). In the example of FIG. 1, the multi-tenant compute service system may provide the image recognition service when the client needs it and decommissioned when it is no longer needed, such that the resources supporting the image recognition service (e.g., access to software application 102, and the underlying hardware resources for processing software application 102) can be reallocated to other clients.

As shown in FIG. 1, software application 102 can receive pixel data of an image 104 from a user. Image 104 may include an array of pixels. Software application 102 can perform analysis on the pixel data, and predict one or more objects 106 depicted in image 104. The analysis may include, for example, comparing the pixel data against a set of pre-determined image features. As to be discussed in more detail below, software application 102 may employ prediction model 103 to compute a set of scores based on the pixel data of image 104. The set of scores may represent, for example, the likelihood of image 104 including the pre-determined image features. Software application 102 can then determine other information about the content of image 104 based on the scores. For example, based on the scores, software application 102 can determine that image 104 is an image of a panda.

Figure 2A:
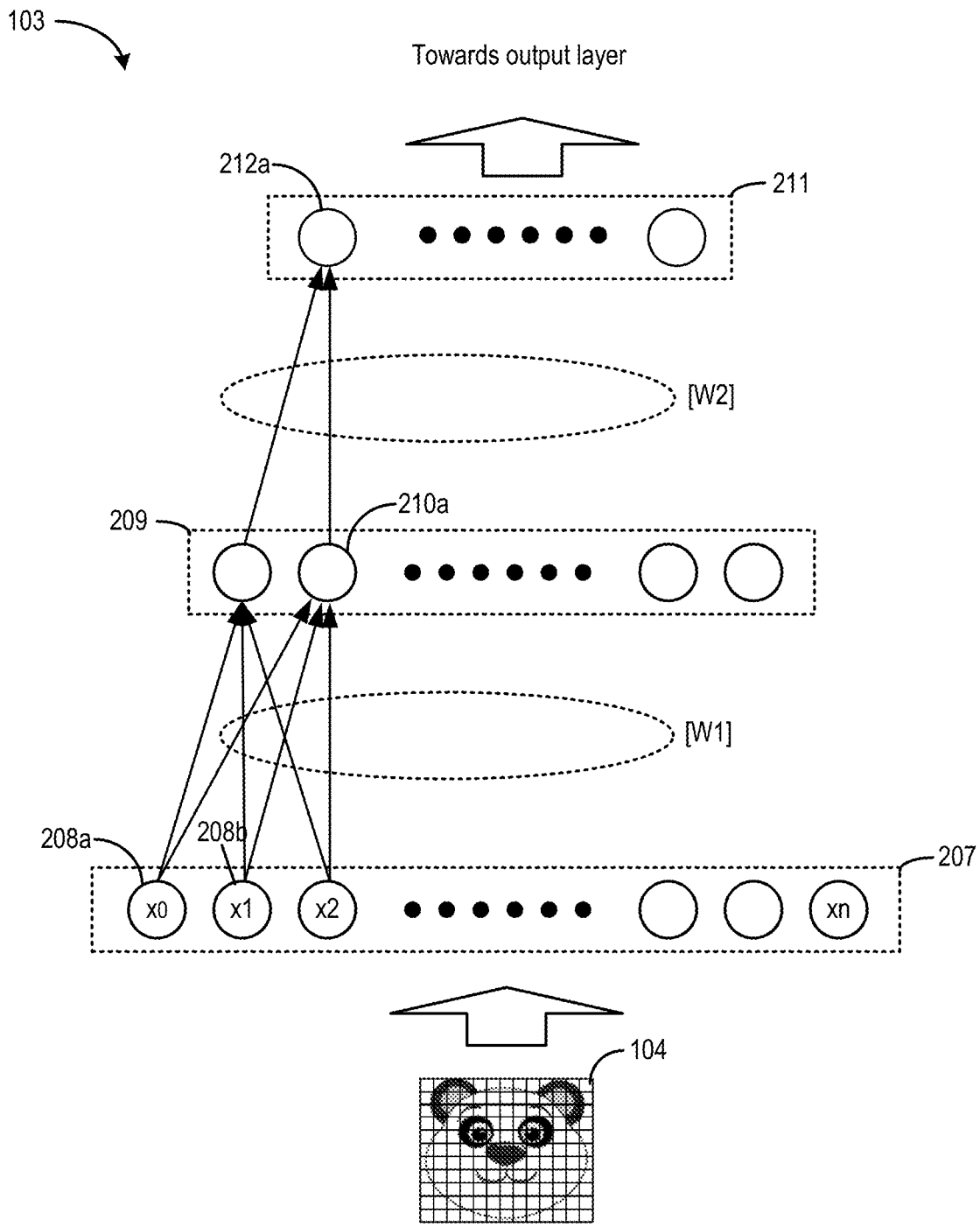
FIGS. 2A-2F are simplified block diagrams illustrating a prediction model and the operations that use techniques disclosed herein, according to certain aspects of the present disclosure.

Prediction model 103 can be in the form of an artificial neural network. The artificial neural network may include a plurality of processing nodes, with each processing node configured to process part of the input pixel data, or to further process the intermediate outputs from other processing nodes. FIG. 2A illustrates an example of prediction model 103 that uses techniques disclosed herein. In the example of FIG. 2A, prediction model 103 may be a multi-layer neural network such as a deep neural network (DNN), a convolutional neural network (CNN), etc. Prediction model 203 may include an input layer 207, a set of intermediate layers including intermediate layers 209 and 211, and an output layer (not shown in FIG. 2).

Layer 207 may process pixel data representing different portions of image 204. For example, in the example of FIG. 2A, layer 207 may process the pixel data of image 204. Each processing node of layer 207 is assigned to receive a pixel value (e.g., $x_0$, $x_1$, $x_2$, . . . $x_n$) corresponding to a predetermined pixel within image 204, and transmit one or more weights with the received pixel value to layer 209. In a case where prediction model 203 is a DNN, each processing node of layer 207 can be assigned a set of weights defined based on a matrix W1. Each processing node of layer 207 can send the received pixel value and the assigned weights to each processing node of layer 209. In a case where prediction model 103 is a CNN, groups of the processing nodes of layer 207 may share a set of weights, and each group may send the set of weights and the pixel values received by the group of processing nodes to a single processing node of layer 209.

Layer 209 may process the scaled outputs from layer 207 to generate a set of intermediate outputs. For example, assuming processing node 210a of layer 209 is connected to n processing nodes in layer 207, processing node 210a may generate a sum of the scaled outputs received from layer 207 based on the following equation:

$$sum_{210a} = \sum_{i=0}^{n}(W1_i \times x_i) \qquad \text{(Equation 1)}$$

Here, $sum_{210a}$ represents a sum generated by processing node 210a. $W1_i \times x_i$ represents a scaling of a particular pixel value (e.g., $x_0$) with the associated weight (e.g., $W1_0$) by a processing node of layer 207. In a case where prediction model 103 is a DNN, each processing node of layer 209 may generate the sum based on the scaling of pixel values from each processing node of layer 207, and then generate a sum (e.g., $Sum_{210a}$) by summing the scaled pixel values. The sum may also represent a dot-product between an input vector comprising a number of elements (e.g., pixel values) and a weight vector (e.g., W1).

Figure 2B:
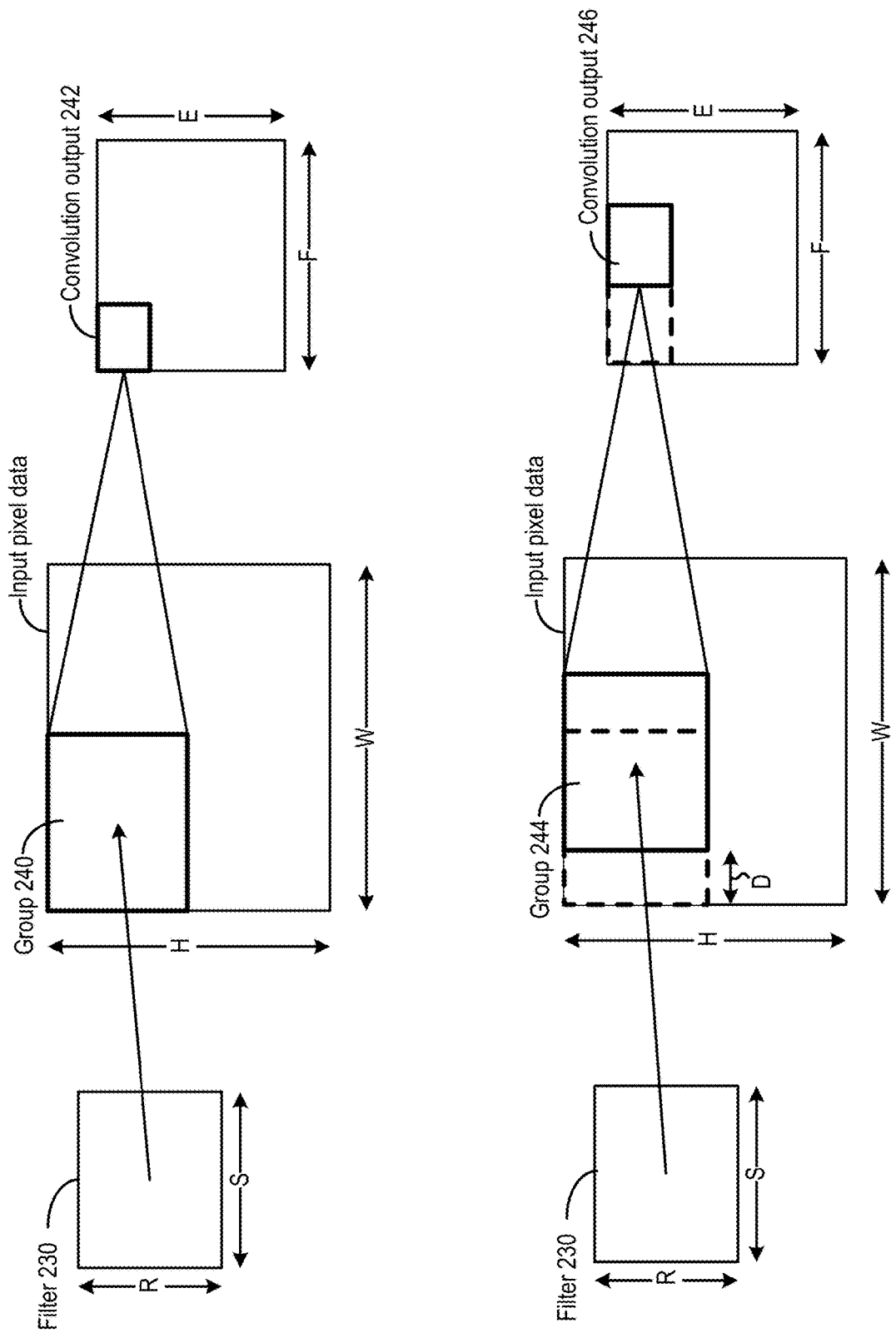
Figure 2C:
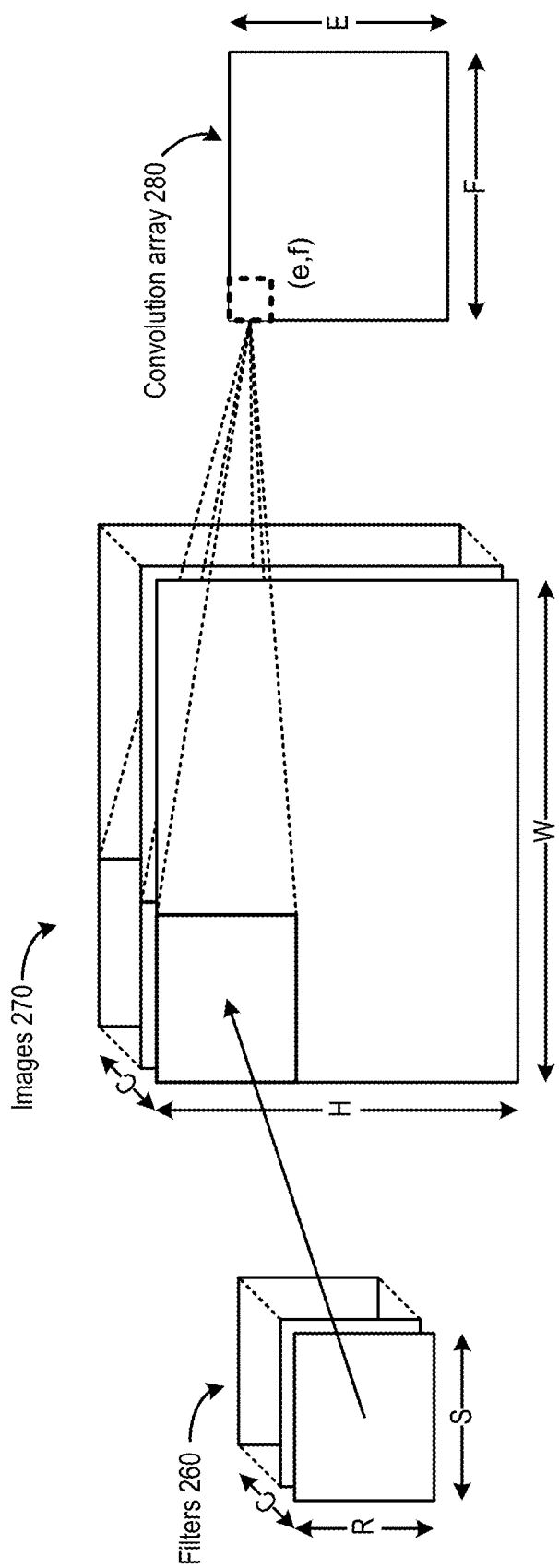

On the other hand, in a case where prediction model is a 103 CNN, each processing node of layer 209 may generate the sum based on the scaling of pixel values from a group of processing nodes of layer 207. The sum may represent a convolution result between a group of pixel values and a filter comprising the weight values. FIG. 2B illustrates an example of a convolution operation layer 209 may perform. In FIG. 2B, filter 230 may include a two-dimensional array of weights. The weights in filter 230 may represent a spatial distribution of pixels for certain features to be detected from the image. The two-dimensional array may have a height of R rows and a width of S columns, and is typically smaller than an input image with a height of H pixels and a width of W pixels. Each weight may be mapped to a pixel in a rectangular block of pixel values with the same R rows and S columns. A processing node of layer 209 (e.g., processing node 210a) can receive, from a group of processing nodes of input layer 207, a group 240 of pixel values corresponding to a first rectangular block of pixels from the input image, and generate a convolution output 242 based on a summation of multiplication results between each weight of filter 230 and each corresponding pixel in group 240 according to Equation 1, to generate a dot-product between a matrix represented by filter 230 and a matrix represented by group 240. Another processing node of layer 209 can also receive, from another group of processing nodes of input layer 207, a group 244 of pixel values corresponding to a second rectangular block of pixels from the input image, and generate a convolution output 246 based on a summation of multiplication results between each weight of filter 230 and each corresponding pixel in group 244 according to Equation 1, to generate a dot-product between the matrix of filter 230 and a matrix represented by group 240. In some examples, each convolution output in FIG. 2B (e.g., convolution output 242, convolution output 246, etc.) can correspond to the output of a processing node of layer 209. In some examples, the pixel data in the input image may be referred to as an input feature map to indicate that the pixels are processed by the same filter (or same sets of filters) corresponding to certain feature(s). The convolution outputs may be referred to as an output feature map to indicate that the output is the result of processing an input feature map with the filter.

As shown in FIG. 2B, the convolution operations can be arranged in a sliding-window such that the second rectangular block overlaps, or is otherwise adjacent to, the first rectangular block in the input image. For example, in the example of FIG. 2B, D may be a distance of stride (in pixel) of the sliding-window for each convolution operations, such that the block of pixels corresponding to group 244 may be situated at a distance D (in terms of pixels) from the block of pixels corresponding to group 240, and the next block of pixels may also be situated at the same distance D from group 244. Other processing nodes of layer 209 may also receive groups of pixels corresponding to other rectangular blocks and generate other intermediate outputs. The convolution outputs can be part of a convolution output array 280 with a height of E rows and a width of F columns. The array of convolution outputs can have a smaller height and a smaller width than the input image. Rectangular blocks of the convolution outputs can be further grouped, and convolution operations can be performed at layer 211 between the groups of convolution outputs and another set of filter weights to generate another set of convolution outputs.

In some examples, the convolution operations can be performed between multiple images and multiple filters. For example, referring to FIG. 2C, a set of C filters 260 may correspond to a number (C) of images 270, and convolution operations can be performed between each filter of the set of filters 260 and blocks of pixels on the corresponding image of images 270. The convolution results for each filter-image pair can be summed to generate a convolution output as follows:

$$O_{e,f} = \sum_{r=0}^{R-1}\sum_{s=0}^{S-1}\sum_{c=0}^{C-1} X^c_{eD+r,fD+s} \times W^c_{r,s} \qquad \text{(Equation 2)}$$

Here, the convolution operation involves the images (or pixel arrays). $X^c_{eD+r,fD+s}$ may refer to the value of a pixel at an image of index c, within the number (C) of images 270, with a horizontal pixel coordinate of eD+r and a vertical pixel coordinate of fD+s. D is the sliding-window stride distance, whereas e and f correspond to the location of the output in the convolution output array, which can also correspond to a particular sliding window. Further, r and s correspond to a particular location within the sliding window. A pixel at an (r,$) location and of an image of index c can also correspond to a weight $W^c_{r,s}$ in a corresponding filter of the same index c at the same (r,s) location. Equation 2 indicates that to compute a convolution output $O_{e,f}$, each pixel within a sliding window (indexed by (e,f)) may be multiplied with a corresponding weight $W^c_{r,s}$. A partial sum of the multiplication products within each sliding window for each of the images within the image set can be computed. And then a sum of the partial sums for all images of the image set can be computed.

Moreover, in some examples, multiple sets of filters can be used to perform convolution operations with a set of images to generate a set of convolution output arrays, with each convolution output array corresponding to a set of filters. For example, the multiple sets of filters may correspond to multiple image features to be detected from the set of images, and each convolution output array corresponds to the detection results for each image feature from the set of images. For example, where M sets of filters are applied to C images to generate M convolution output arrays, Equation 2 can be updated as follows:

$$O_{e,f}^m = \sum_{r=0}^{R-1} \sum_{s=0}^{S-1} \sum_{c=0}^{C-1} X_{eD+r,fD+s}^c \times W_{r,s}^{c,m}$$ (Equation 3)

Here, convolution output $O_{e,f}^m$ and weight $W_{r,s}^{c,m}$ has an index m corresponding to one of the M sets of filters.

Figure 2D:
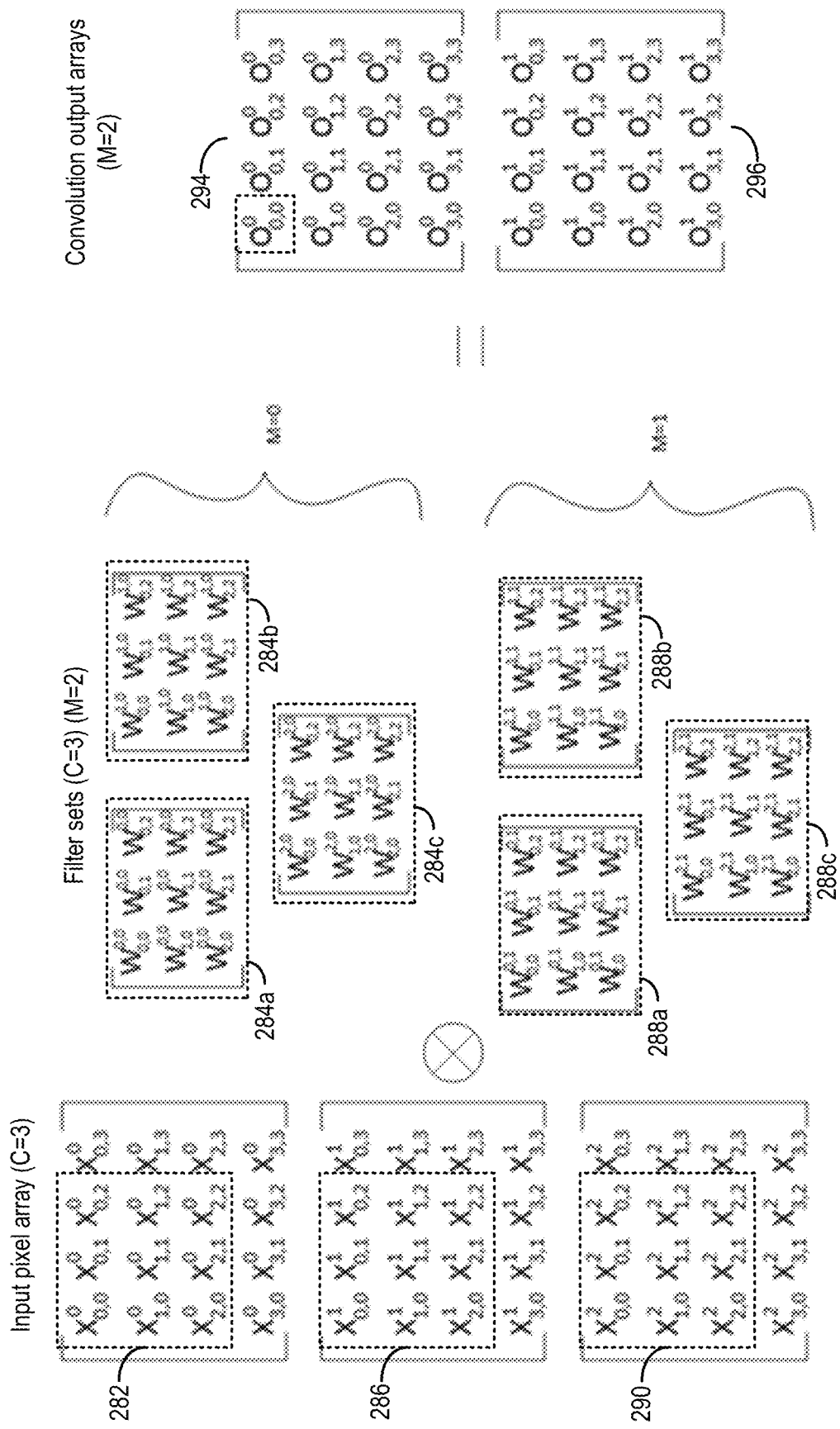

FIG. 2D illustrates an example of C sets of input data sets (with C=3) to be convolved with M sets of filters (with M=2). Each set of input data corresponds to the entries of a pixel group. For example, each of pixel groups 282, 286, and 290 may correspond to one input data set. Each of the M sets of filters includes a set of C filters which correspond to the C sets of input pixel arrays. In the example of FIG. 2D, there are two filter sets where the first filter set comprises filter arrays 284a, 284b, and 284c and the second filter set comprises filter arrays 288a, 288b, and 288c. The convolution operations generate M sets of output data sets, with each output data set corresponding to a convolution output array. In the example of FIG. 2D, two convolution output arrays 294 and 296 are generated. Each convolution output array corresponds to convolving one set (of the M sets) of filters with the input pixel arrays. For example, first element $O_{0,0}^0$ of convolution output array 294 can be generated by a sum of a dot-product between pixel group 282 and filter array 284a, a dot-product between pixel group 286 and filter array 284b, and a dot-product between pixel group 290 and filter array 284c.

Figure 2E:
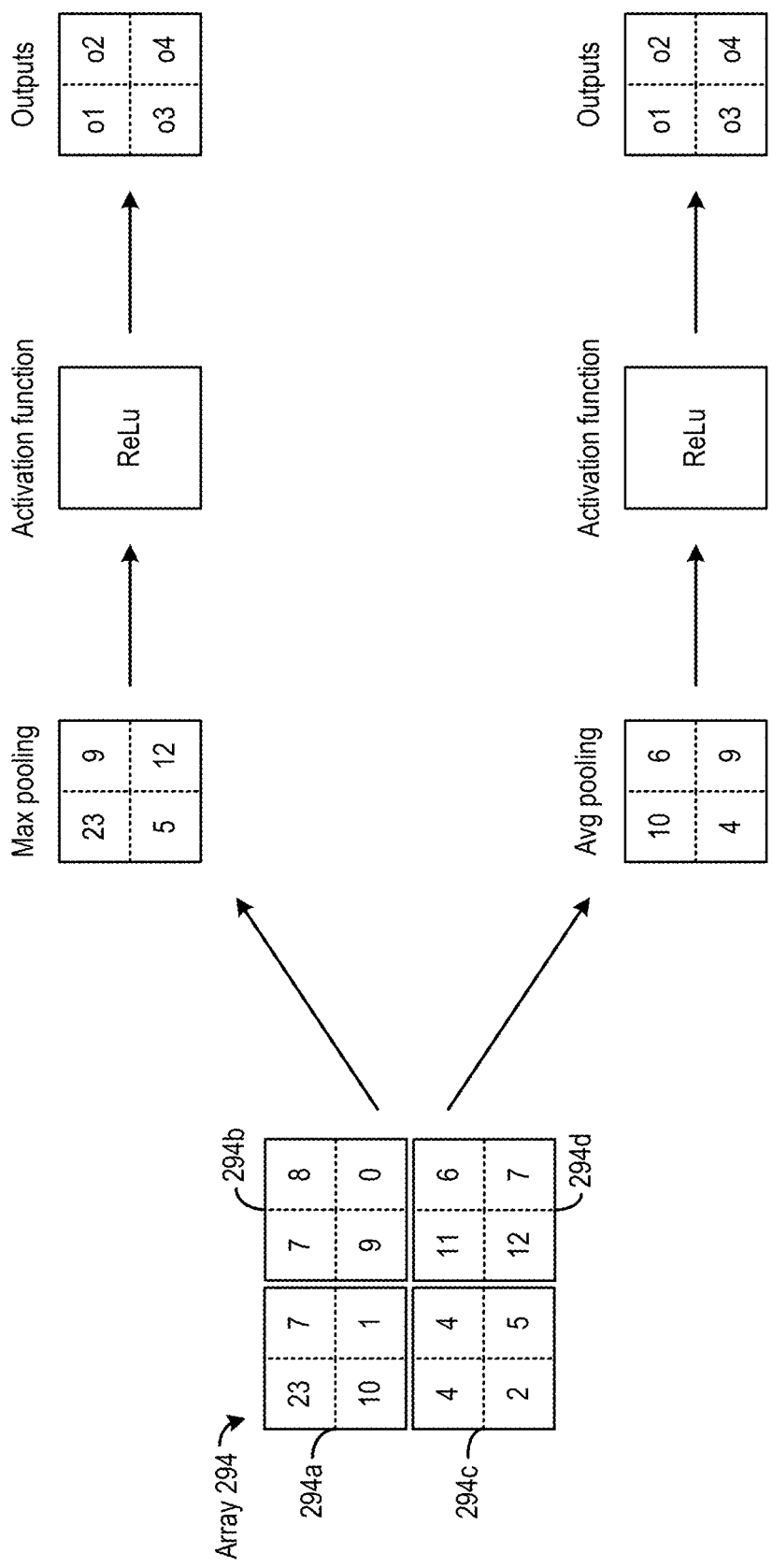

Referring back to FIG. 2A, one processing node of layer 209 may be configured to generate one convolution output array, and a set M of processing nodes of layer 209 can correspond to a set M of convolution output arrays. The processing node of layer 209 can also post-process each convolution output with a pooling operation followed by an activation function to generate a final output for layer 209. As discussed above, a pooling operation may include generating subsamples of the convolution output to reduce the output data size, which can reduce the computation complexity and improve system performance, while trading-off on the processing accuracy. In some cases, the pooling operation can also be skipped to avoid the degradation in the processing accuracy. Reference is now made to FIG. 2E, which illustrates examples of post-processing of the convolution output. In the examples of FIG. 2E, the convolution output comprises an 4×4 array 294. Array 294 can be divided into four partition arrays including arrays 294a, 294b, 294c, and 294d. Two alternative examples of pooling operations on the partitions are illustrated. In a maximum pooling ("max pooling" of FIG. 2E) operation, the maximum value of each partition array can be selected as a subsample representing each partition array. In the max pooling example of FIG. 2E, a maximum value of 23 is selected from partition array 294a, a maximum value of 9 is selected from partition array 294b, a maximum value of 5 is selected from partition array 294c, whereas a maximum value of 12 is selected from partition array 294d. In the average pooling example ("avg pooling" of FIG. 2E), an average value of 10 can be computed from partition array 2394a, an average value of 6 is computed rom partition array 294b, an average value of 4 is computed from partition array 294c, whereas an average value of 9 is computed from partition array 294d. In both of the maximum pooling and average pooling examples of FIG. 2E, the convolution output array has been downsized from an 4×4 array to a 2×2 array.

Following the pooling operation, the subsamples of the convolution output (or the convolution output if the pooling operation is skipped) can be processed using an activation function. The activation function may translate the convolution output (or subsamples) into a decision of whether to forward the convolution output (or subsamples) to upper layers. The generation of the decision can be analogous to the firing of an actual biological neuron. An example of an activation function can be a rectified linear unit (ReLu) defined according to the following equation:

$$ReLu(y) = max(0, y)$$ (Equation 4)

Figure 2F:
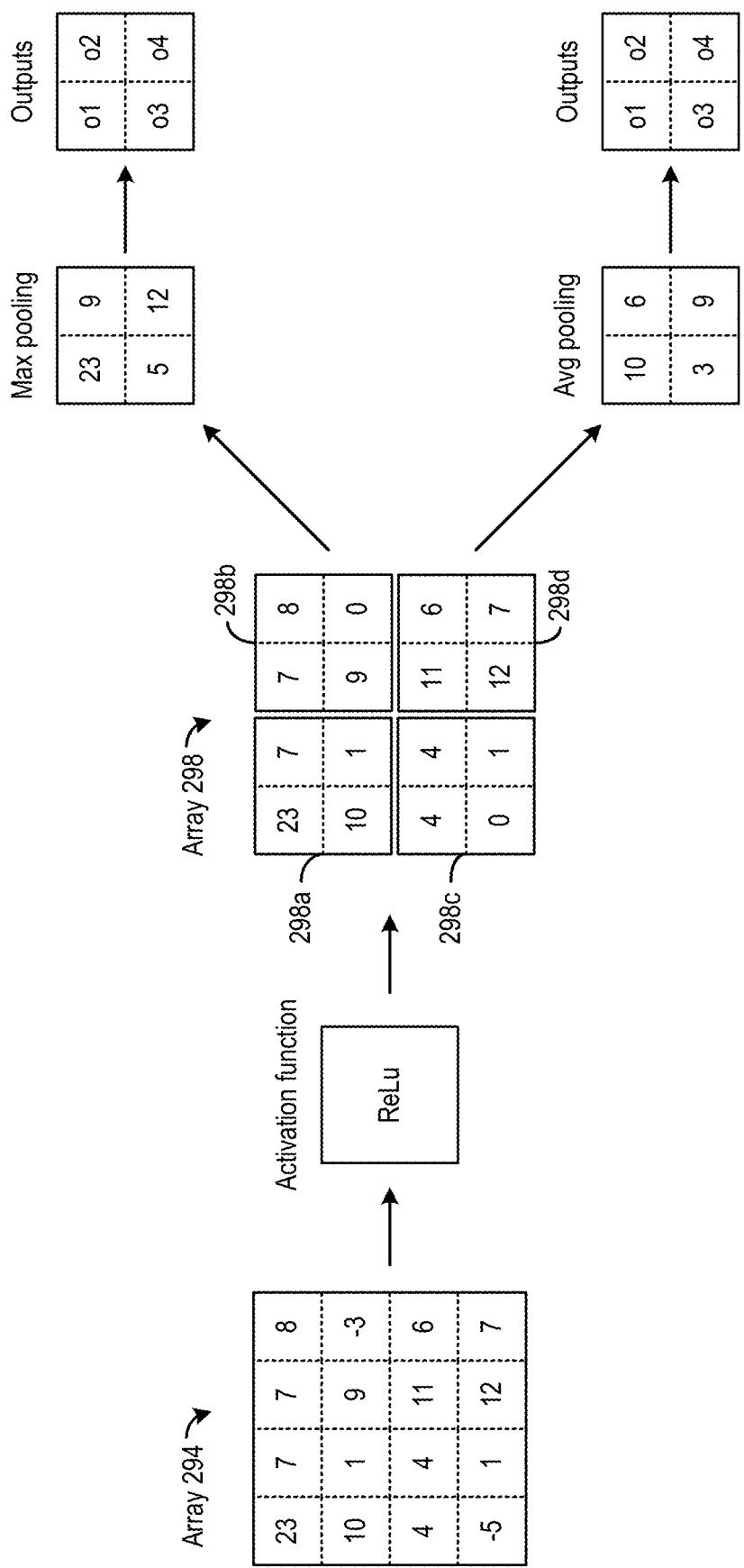

FIG. 2F illustrates another example of post-processing of the convolution output. In the example of FIG. 2F, each element of the convolution output array 294 can be processed by an activation function (e.g., ReLu) to generate intermediate output array 298. Array 298 can be divided into four partition arrays including arrays 298a, 298b, 298c, and 298d. Pooling operations (e.g., maximum pooling, average pooling, etc.) can then be performed on array 298 to generate the subsample outputs.

A processing node of layer 209 (e.g., processing node 210a) may process the convolution output subsamples with the ReLu function to generate intermediate outputs based on Equation 4. Layer 211 may further process the intermediate outputs from layer 209 by, for example performing additional convolution operations based on different sets of filters. The outputs from each processing node of layer 211 may be forwarded to other higher intermediate layers, or to an output layer (not shown in FIG. 2A). The output layer may form an output vector representing, for example, a probability that a certain image feature is included in image 104, and/or a probability that image 104 includes an image of a panda. For example, the output vector may be compared against a reference vector associated with a nose object of a panda, or a reference vector associated with a panda. A decision about whether image 104 is an image of a panda can be determined based on the comparison result.

Figure 3A:
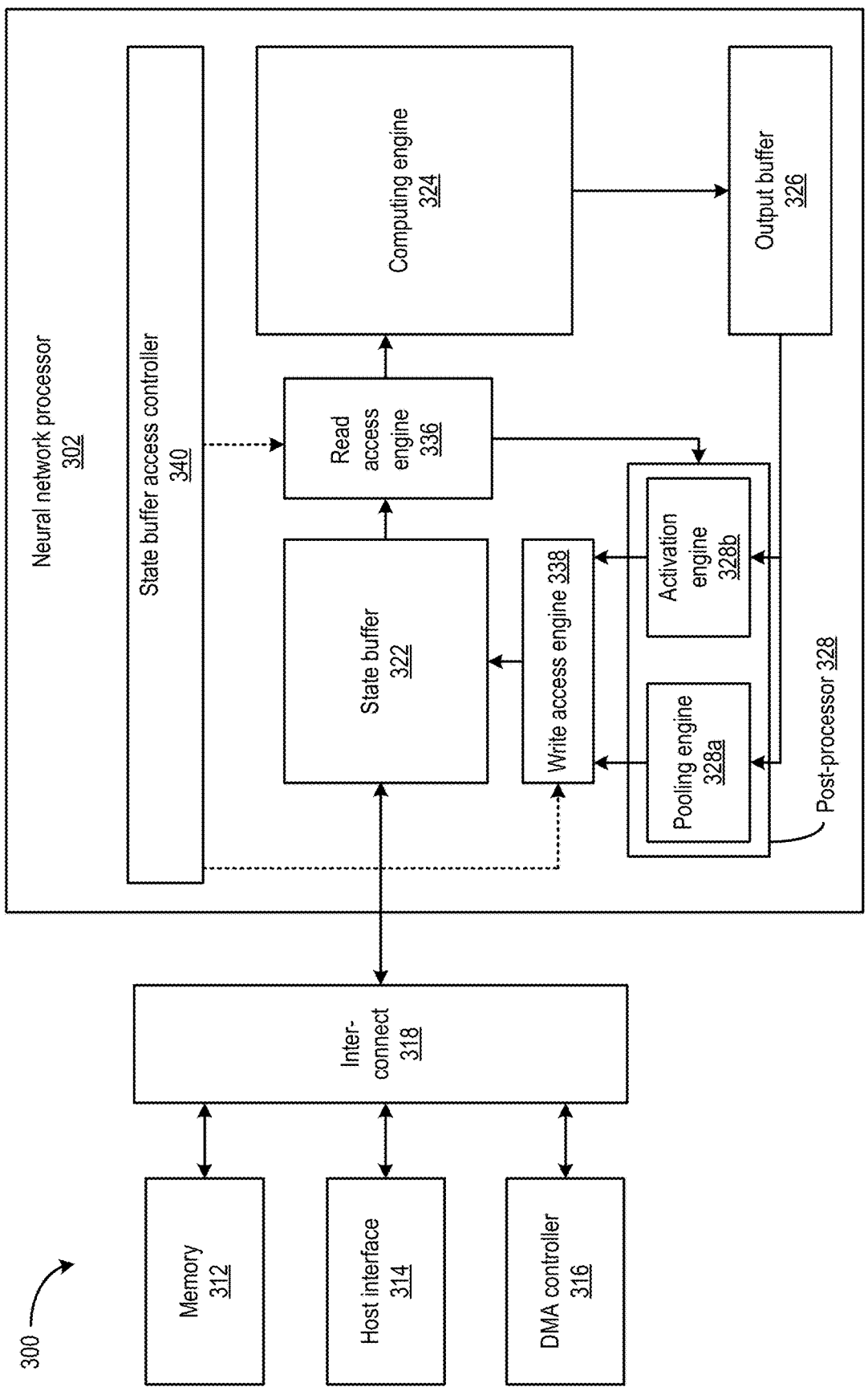
FIGS. 3A-3F are simplified block diagrams for some of the internal components of an apparatus for implementing the prediction model of FIGS. 2A-2E, according to certain aspects of the present disclosure.

FIG. 3A shows an apparatus 300 according to some embodiments of the present disclosure. Apparatus 300 may be part of a computer system, e.g., a host server. Apparatus 300 may be part of a multi-tenant compute service system and can communicate with a host device (not shown in FIG. 3A) to provide computing and memory resources for a computing service. For example, referring back to FIG. 1, apparatus 300 may provide computing and memory resources for computations with prediction model 103. A host device can operate software application 202 and communicate with apparatus 300 to perform one or more image recognition tasks based on computations with prediction model 103.

In the example of FIG. 3A, apparatus 300 may include a neural network processor 302 coupled to memory 312, a direct memory access (DMA) controller 316, and a host interface 314 via an interconnect 318. As to be discussed in more detail, neural network processor 302 can provide the computing resources to support the computations with prediction model 103. Memory 312 may be configured to store the instructions, input data (e.g., pixel data of image 204) and the weights (e.g., the filter data) received from the host device. Memory 312 may also be configured to store the output of neural network processor 302 (e.g., one or more image recognition decisions on the input images) at memory 312. Memory 312 may include any suitable memory, e.g., dynamic random access memory (DRAM), synchronous DRAM (SDRAM), double data rate DRAM (DDR DRAM), storage class memory (SCM), flash memory devices, etc.

DMA controller 316 may be configured to perform DMA operations to transfer data between neural network processor 302 and the host device. For example, as discussed above, the host device can store the instructions, input data, and the weights at memory 312. The host device can provide the memory addresses for the stored instructions, data, and weights to neural network processor 302 (e.g., in the form of memory descriptors). Neural network processor 302 can then obtain the stored instructions, data, and weights based on the memory addresses provided by the host device. Neural network processor 302 can also store the results of computations (e.g., one or more image recognition decisions) at memory 312, and provide the memory addresses for the stored results to the host device.

Host interface 314 may be configured to enable communication between the host device and neural network processor 302. For example, host interface 314 may be configured to transmit the memory descriptors including the memory addresses of the stored data (e.g., input data, weights, results of computations, etc.) between the host device and neural network processor 302. Host interface 314 may include, for example, a peripheral component interconnect express (PCIe) interface or any suitable interface for communicating with the host device.

Neural network processor 302 can provide the computing resources to support the neural network computations for prediction model 103. In the example of FIG. 3A, neural network processor 302 may be an integrated circuit, such as a system on chip (SoC), and can include a number of circuit components, a state buffer 322, a computing engine 324, an output buffer 326, and a post-processor 328. In addition, neural network processor 302 may also include a read access engine 336 and a write access engine 338 to provide read and write access to state buffer 322 for computing engine 342 and post-processor 328, as to be discussed in detail below.

State buffer 322 may be configured to provide caching of data used for computations at computing engine 324. The data cached at state buffer 322 may include, for example, the input data and weights obtained from memory 312, output data of computing engine 324, as well as output data of post-processor 328. The caching can reduce the effect of memory access bottleneck (e.g., caused by the latencies at memory 312, DMA controller 316, interconnect 318, etc.) on the performance of computing engine 324. State buffer 322 can be an on-chip memory device and may include, for example, static random access memory (SRAM). State buffer 322 can also be partitioned based on the organization of computing engine 324. For example, state buffer 322 can include multiple SRAM banks, with each bank configured to store input data and weights for a row of computing engine 324.

Figure 3B:
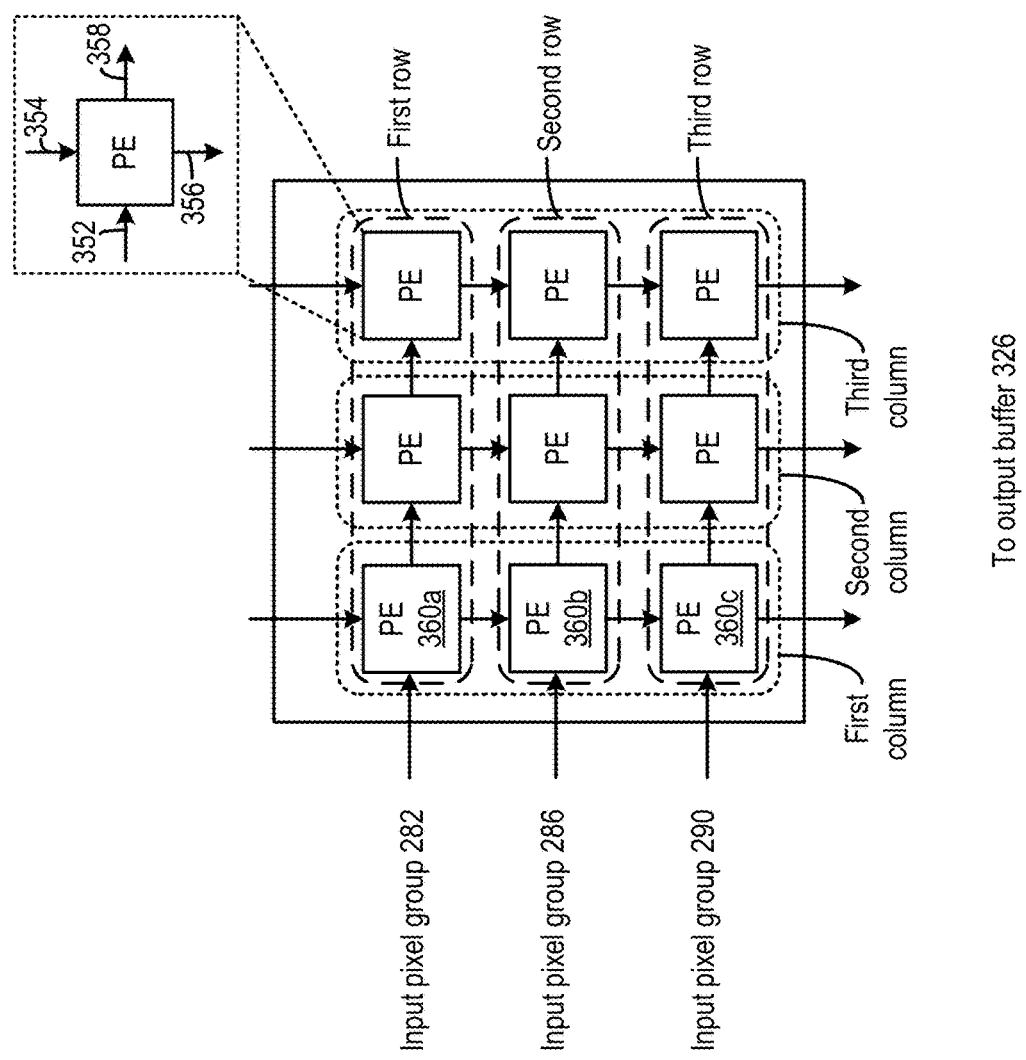

Computing engine 324 may include a set of processing elements (PE) configured to perform one or more arithmetic operations involved in neural network computations. Computing engine 324 may include a two-dimensional array of processing elements arranged in multiple rows and columns similar to a systolic array. Reference is now made to FIG. 3B, which illustrates an example of computing engine 324. In the example of FIG. 3B, computing engine 324 includes a 3×3 array with three PEs in each row and three PEs in each column. Each PE may include a row input bus 352, a column input bus 354, a column output bus 356, and a row output bus 358. A PE may receive inputs from a left PE of the same row (or from external circuitries) via row input bus 352. The PE may also receive inputs from an above PE of the same column (or from external circuitries) via column input bus 354. The PE may perform arithmetic operations based on the inputs, and transmit the result of the arithmetic operations to a lower PE of the same column below (or to external circuitries) via column output bus 356. The PE may also forward the inputs to a right PE of the same row, via row output bus 358.

Each row of computing engine 324 may process one input data set comprising multiple input data elements, whereas each column of computing engine 324 generates a weighted sum of input data elements of different input data sets. As an illustrative example, in a case where computing engine 324 is to process pixel groups 282, 286, and 290 of FIG. 2D, a first row may receive elements of pixel group 282, a second row may receive elements of input pixel array 286, and a third row may receive elements of input pixel array 290. Each PE includes a multiplier and an adder to handle one input data element at a time. A PE may receive one input data element and a weight (e.g., from row input bus 352) and generate, using the multiplier, a multiplication product to represent a weighted input data element. Moreover, the PE also receives a partial weighted sum from the PE above. The partial weighted sum represents the weighted sum of input data elements of input data sets received by each row above that PE. The PE adds the weighted input data element to the partial weighted sum, and passes the updated partial weighted sum to the PE below, and the PEs at the third row can generate a weighted sum of input data elements received by the three rows.

The operations of each PE of computing engine 324 can be synchronized to a continuous clock signal to improve the interoperability between computing engine 324 and other components of neural network processor 302. Each PE may include sequential logic circuitries (e.g., registers, state machines, etc.) to store input data, weights, and output data for the adder and multiplier circuitries, and to synchronize the flow of the data into and out of the circuitries. The sequential logic circuitries of each PE can be clocked by either the same continuous clock signal or a replica of the clock signal. For example, in a first clock cycle, PE 360b of the second row may receive a first input data element of pixel group 286 (e.g., $X_{0,0}^1$), as well as a partial sum comprising weighted first input data element of pixel group 282 (e.g., $W_{0,0}^{0,0} \times X_{0,0}^0$) from PE 360a of the first row. Within the first clock cycle, PE 360b may multiply the input data element $X_{0,0}^1$ with weight $W_{0,0}^{1,0}$, add the multiplication product to the partial sum to generate an updated partial sum of $W_{0,0}^{0,0} \times X_{0,0}^0 + W_{0,0}^{1,0} \times X_{0,0}^1$, and store the updated first partial sum in the set of internal registers. In the second clock cycle, PE 360b may forward the updated first partial sum to PE 360c below. In the third clock cycle, PE 360c can output a partial sum of $W_{0,0}^{0,0} \times X_{0,0}^0 + W_{0,0}^{1,0} \times X_{0,0}^1 + W_{0,0}^{2,0} \times X_{0,0}^2$.

Each column of computing engine 324 may correspond to a different processing node of a neural network layer, and each column can apply a different set of weights to generate different weighted sums for different output data sets. For example, the first column may apply weights of filter arrays 284a, 284b, and 284c of FIG. 2D to generate a weighted sum of $W_{0,0}^{0,0} \times X_{0,0}^{0} + W_{0,0}^{1,0} \times X_{0,0}^{1} + W_{0,0}^{2,0} \times X_{0,0}^{2}$ for the computation of the first element ($O_{0,0}^{0}$) of convolution output array 294 of FIG. 2D. The second column may apply weights of filter arrays 288a, 288b, and 288c of FIG. 2D to generate a weighted sum of $W_{0,0}^{0,1} \times X_{0,0}^{0} + W_{0,0}^{1,1} \times X_{0,0}^{1} + W_{0,0}^{2,1} \times X_{0,0}^{2}$ for the computation of the first element ($O_{0,0}^{1}$) of convolution output array 296 of FIG. 2D. Moreover, each column can also operate sequentially to generate additional weighted sums. For example, the first column may generate a weighted sum of first input data elements of input pixel groups 282, 286, and 290 ($W_{0,0}^{0,0} \times X_{0,0}^{0} + W_{0,1}^{1,0} \times X_{0,1}^{1} + W_{0,1}^{2,0} \times X_{0,1}^{2}$) in a first pass. In a second pass, the first column may generate a weighted sum of second input data elements of input pixel groups 282, 286, and 290 ($W_{0,0}^{0,0} \times X_{0,1}^{0} + W_{0,1}^{1,0} \times X_{0,1}^{1} \times W_{0,1}^{2,0} \times X_{0,1}^{2}$). The weighted sums can be accumulated at output buffer 326 to generate the first element ($O_{0,0}^{0}$) of convolution output array 294 according to Equation 3. The second column may also generate, in different passes, the weighted sums for the first element ($O_{0,0}^{1}$) of convolution output array 296 according to Equation 3. While each column may generate the weighted sum in sequential passes, the generation of the weighted sums by each column can be performed in parallel to improve the rate of output data generation as well as the throughput of the neural network processing.

Referring back to FIG. 3A, post-processor 328 can be configured to perform post-processing on the elements of the convolution output arrays provided by output buffer 326 to generate final outputs for the neural network layer. In the example of FIG. 3A, post-processor 328 includes a pooling engine 328a and an activation engine 328b. Pooling engine 328a can perform, for example, maximum pooling, average pooling, etc., on the convolution output array elements to generate subsamples, and store the subsamples at state buffer 322. Pooling engine 328a can also be controlled to skip the pooling operation and store each element at state buffer 322. The subsamples (or each element) of the convolution output arrays can be stored at state buffer 322 as intermediate outputs of post-processor 328. Activation engine 328b can retrieve the subsamples (or each element) of the convolution output arrays from state buffer 322, and apply one or more activation functions (e.g., ReLu function) on the retrieved data, to generate the final output data. Activation engine 328b may include one or more lookup tables (e.g., in the form of multiplexer circuits) to implement the activation functions.

Both pooling engine 328a and activation engine 328b may be configured to retrieve and data (e.g., from state buffer 322) to perform the post-processing (e.g., pooling and activation function processing) in batches. A post-processing batch can start as soon as output buffer 326 generates a set of new convolution output array elements. Compared with in a case where the post-processing is not started until each element of the convolution output arrays is generated, batch processing can speed up the post-processing and reduces the storage space requirements at output buffer 326 and post-processor 328 to support the post-processing operations. For example, referring to the example of FIG. 3E, pooling engine 328a may start a new batch processing whenever four new elements of a convolution output array are generated at output buffer 326 (for each column of computing engine 324). Pooling engine 328a may either perform a pooling operation (e.g., average pooling, maximum pooling, etc.), or perform no pooling operation, on the four new elements. Depending on whether a pooling operation is performed, pooling engine 328a may store one subsample of the four elements, or the four elements, at state buffer 322. Pooling engine 328a then starts a new batch processing after another four new elements of the convolution output array are generated.

Activation engine 328b can also perform the activation function processing in batches. For example, after new subsamples (or the four new elements) are stored at state buffer 322, activation engine 328b can retrieve the subsamples (or the four new elements) from state buffer 322 and apply the activation function processing to generate the final output data elements. The final output data elements can be stored as the input data for the next neural network layer computations at state buffer 322.

Read access engine 336 can provide read access to state buffer 322 for a read access requester device including, for example, computing engine 324 and post-processor 328. Moreover, write access engine 338 can provide write access to state buffer 322 for a write access requester device including, for example, post-processor 328. Each of read access engine 336 and write access engine 338 can convert a sequential series of access operations (e.g., multiple read or write operations across multiple clock cycles) to a single access operation to reduce power and reduce wait latency, as discussed above. Each of read access engine 336 and write access engine 338 may be organized based on state buffer 322. For example, each of read access engine 336 and write access engine 338 may include multiple sub-engines corresponding to multiple SRAM banks of state buffer 322, with each sub-engine providing access to the corresponding SRAM bank. A sub-engine of read access engine 336 can convert a sequential series of read access operations to the corresponding SRAM bank for multiple data elements (e.g., by a row of computing engine 324 or by post-processor 328) to a single read access for the multiple data elements. A sub-engine of write engine 338 can also convert a sequential series of write accesses for storing multiple data elements at the corresponding SRAM bank (e.g., by post-processor 328) to a single write access for the multiple data elements. Moreover, a sub-engine, coupled with a SRAM bank comprising single-port SRAM devices, can create a memory with multiple read and write access ports.

Figure 3C:
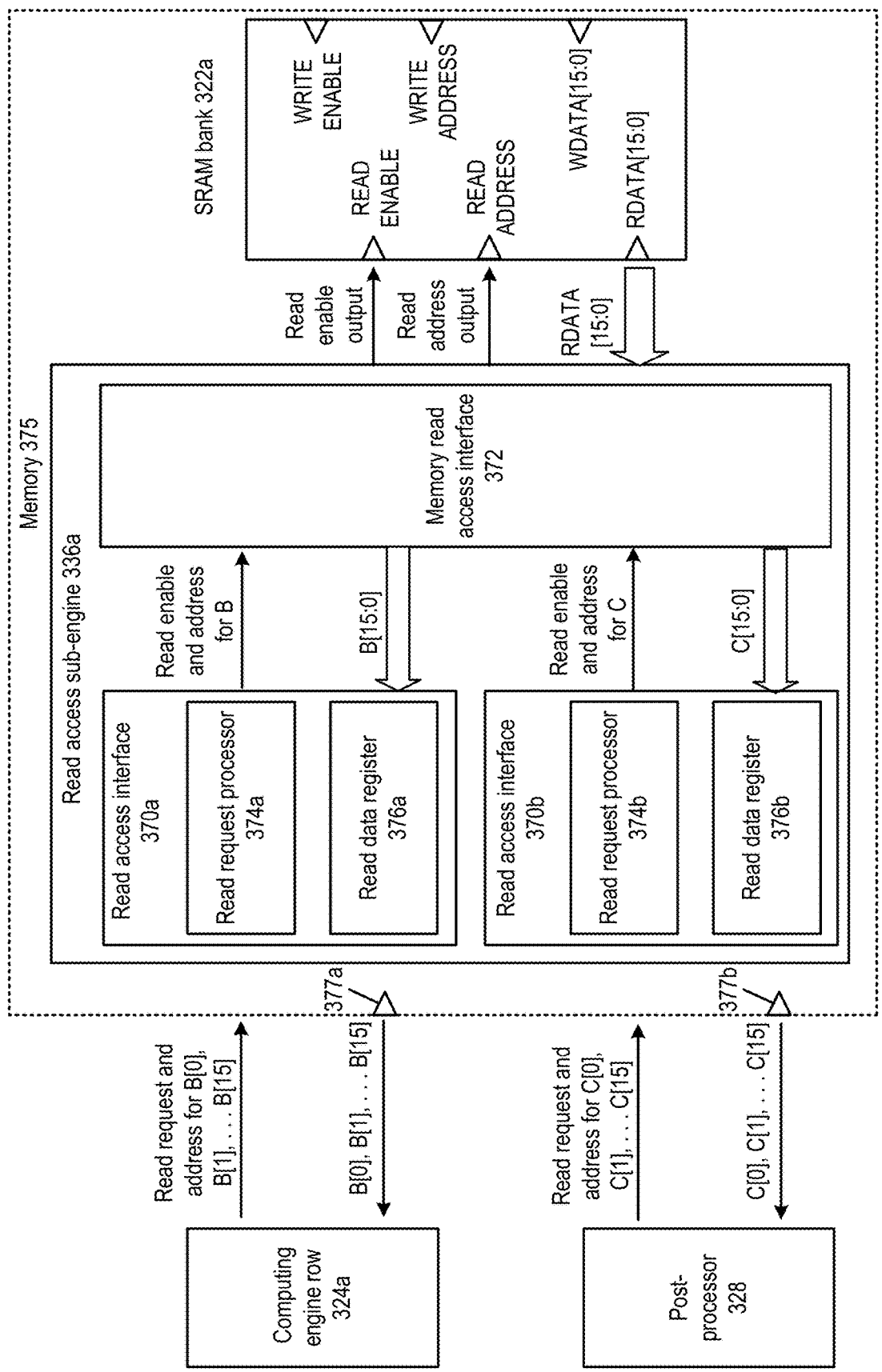

Reference is now made to FIG. 3C, which illustrates an example of a read access sub-engine 336a (of read access engine 336). Read access sub-engine 336a may include read access interfaces 370a and 370b for interfacing with, respectively, row 324a of computing engine 324 and post-processor 328. Read access sub-engine 436a also includes a memory read access interface 372 for interfacing with SRAM bank 322a. SRAM bank 322a may include single port SRAM devices and includes a single read data port RDATA[15:0]. Read access sub-engine 336a and SRAM bank 322a together can form memory 375 with multiple read data ports 377a and 377b.

Each read access interface includes a read request processor (e.g., one of read request processors 374a or 374b) and a read data register (e.g., one of read data registers 376a or 376b). The read data register can be a shift-register that can shift out stored data (e.g., in parallel form) to form a sequential data stream. In some examples, the read request processor can receive a sequence of read requests from a read access requester device, with each read request for a data element. For example, read request processor 374a may receive a sequence of read requests from row 324a of computing engine 324, with each read request for an input data element of an input data set (e.g., $X_{0,0}^{0}$, $X_{0,1}^{0}$, $X_{0,2}^{0}$, etc.), to compute the weighted sums. Moreover, in a case where pooling engine 328a skips the pooling operation, read request processor 374b may receive a sequence of read requests from post-processor 328, with each read request being for a data element of an convolution output array (e.g., $O_{0,0}{}^0$, $O_{0,1}{}^0$, $O_{0,2}{}^0$, etc.), to perform post-processing (e.g., activation function processing, pooling operation, etc.). In some examples, the read request processor can accumulate a pre-determined number of read requests (and the corresponding read addresses), and then initiate a single read operation at state buffer 322 when the pre-determined number of read requests has been accumulated. The pre-determined number can be based on, for example, a size of a read data element requested by each read request, and a size of a read data element to be provided by SRAM bank 322a in a single read operation. For example, in a case where a data element for a read request has a size of 1 byte, and SRAM bank 322a can provide 16 bytes of data element for each read operation (e.g., limited by the output data bus width), the read request processor can accumulate up to 16 read requests and the corresponding read addresses.

In some examples, the read request processor may also receive a single read request from each read access requester device for multiple data elements, or from state buffer access controller 440 on behalf of each read access requester device. The read request may include a starting read address and indicate the pre-determined number of data elements (e.g., 16 input data elements, etc.) to be read from SRAM bank 322a.

After accumulating the pre-determined number of read requests and read addresses (or receiving the single read request including a staring read address and a number of read data pieces to be acquired), the read request processor can transmit a read enable signal and the starting read address to memory read interface 372, which can forward the read enable signal and the read address to SRAM bank 322a to perform a single read operation at SRAM bank 322a. SRAM bank 322a can return the requested read data to memory read interface 372, which can forward the requested read data to the read access interface. The requested read data can be stored in the read data register, which can then provide the requested read data sequentially back to the requester device. In the example of FIG. 3C, read request processor 374a can accumulate 16 read requests and read addresses for one-byte input data elements B[0], B[1], B[2], . . . B[15] from row 324a of computing engine 324, and transmit a read enable signal and the starting read addresses to SRAM bank 322a (via memory read access interface 372), which then returns a 16-byte data B[15:0], between times T1 and T2. The 16-byte data B[15:0] can be stored at read data register 376a. Moreover, read request processor 374b can accumulate 16 read requests and read addresses for one-byte convolution output array elements C[0], C[1], C[2], . . . C[15] from post-processor 328 (one of pooling engine 328a or activation engine 328b), and transmit a read enable signal and the starting read addresses to SRAM bank 322a (via memory read access interface 372), which then returns a 16-byte data C[15:0], between times T3 and T4. Here, the convolution output array elements C[0], . . . C[15] and the input data elements B[0], . . . B[15] may correspond to different batches of computations, and the convolution output array elements C[0], . . . C[15] are not generated from input data elements B[0], . . . B[15]. Between times T4 and T5, read data register 376a can transmit the input data elements sequentially (e.g., start with B[0], followed by B[1], B[2], etc.) back to row 324a of computing engine 324 via read data port 377a. Simultaneously (or at different time period), read data register 376b can also transmit the convolution output data elements sequentially (e.g., start with C[0], followed by C[1], C[2], etc.) back to post-processor 328 via read data port 377b. Such arrangements allow post-processor 328 and computing engine 324 to operate in parallel to process data for different batches of computations, which can reduce the total time needed to complete the different batches of the neural network computations. As a result, the performance of neural network processor 302 can be improved. Moreover, by reducing the access time of SRAM bank 322a, power consumption due to memory access can be reduced as well.

Figure 3D:
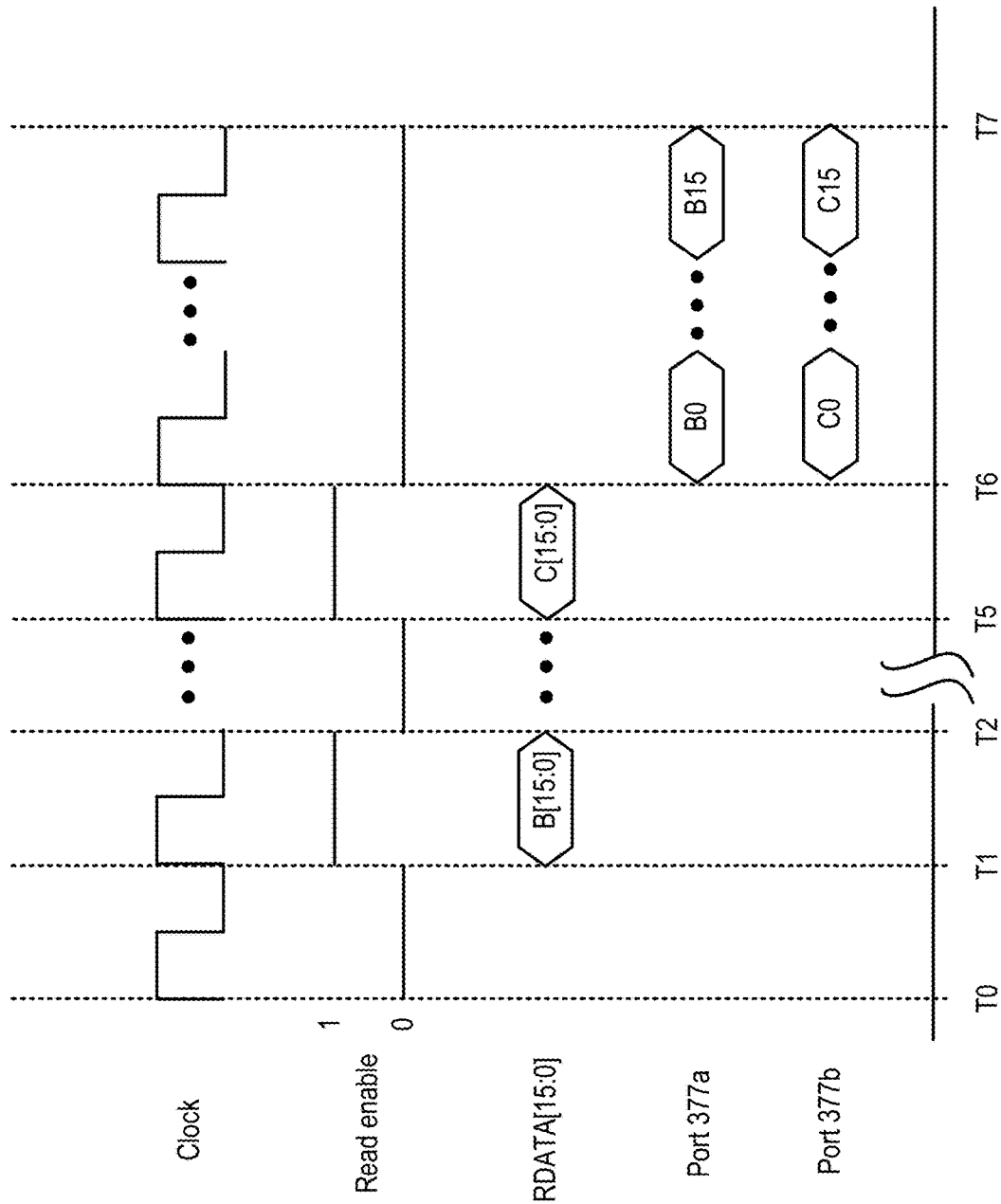

FIG. 3D provides an illustrative example of the operations of read access sub-engine 336a. Memory read interface 372 may transmit a read enable signal for read request processor 354a (corresponding to row 324a of computing engine 324) at time T1, and receive a 16-byte data element B[15:0] (e.g., input data elements) from SRAM bank 322a in one clock cycle between times T1 and T2. The input data elements can be stored at read data register 376a. Between times T3 and T4, read data register 356a can transmit 16 one-byte data elements (B[0], B[1], . . . B[15]) sequentially to row 324a of computing engine 324 in 16 consecutive clock cycles, with one input data element being transmitted for each clock cycle. Memory read interface 372 may also transmit a read enable signal for read request processor 354b (corresponding to activation engine 328b) at time T5, and receive a 16-byte data element C[15:0] (e.g., convolution array output elements generated by row 324a of computing engine 324 and output buffer 326) from SRAM bank 322a in one clock cycle between times T5 and T6. The convolution array output elements can be stored at read data register 356b. Between times T6 and T7, read data register 356b can transmit 16 one-byte data elements C[0], C[1], . . . C[15] sequentially to activation engine 326b in 16 consecutive clock cycles, with one output element being transmitted for each clock cycle.

Figure 3E:
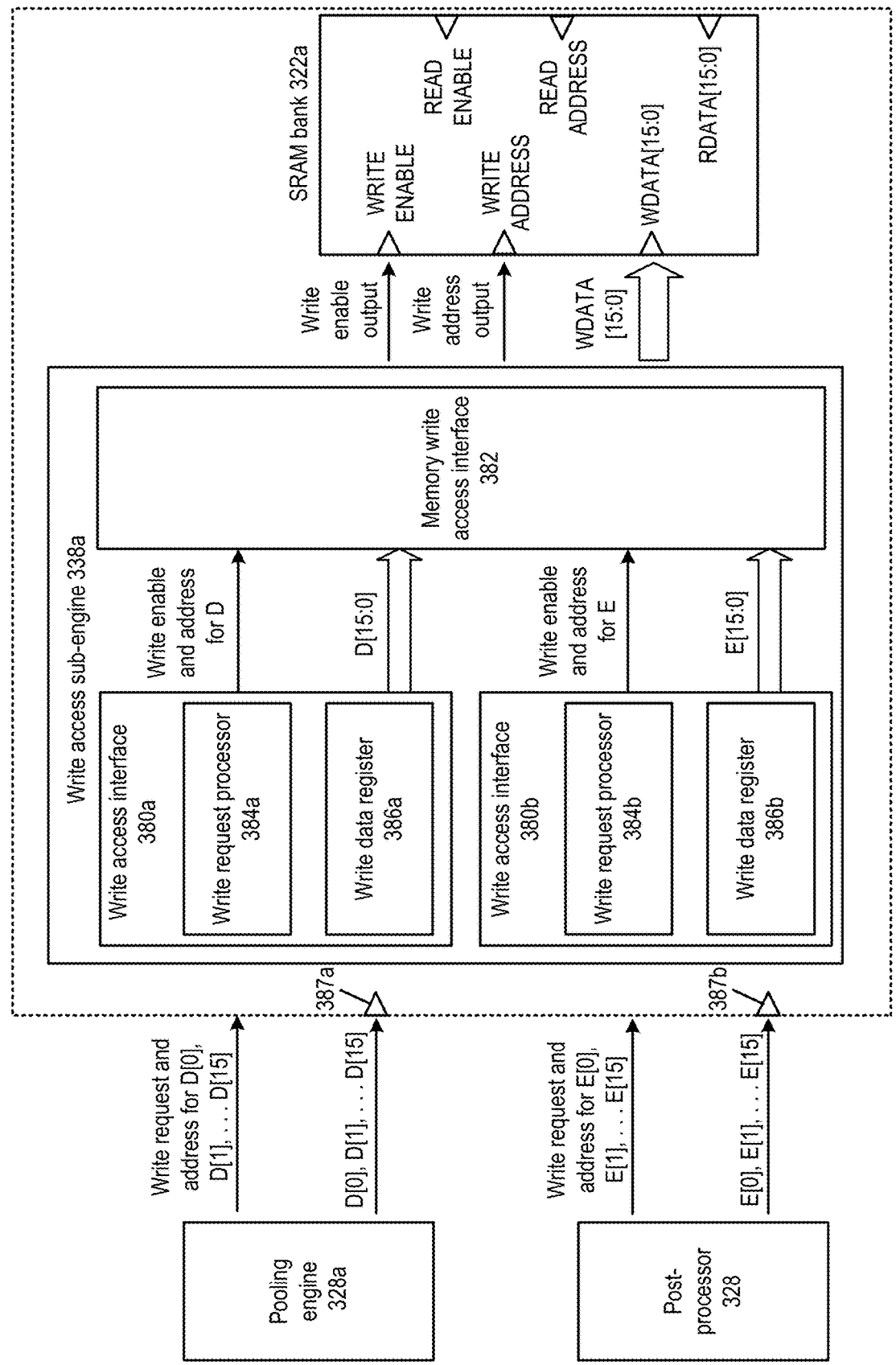

Reference is now made to FIG. 3E, which illustrates an example of a write access sub-engine 338a (of write engine 338). Write access sub-engine 338a may include write access interfaces 380a and 380b for interfacing with post-processor 328 to accept multiple sets of data from post-processor 328 for storage at SRAM bank 322a. Write access sub-engine 338a also includes a memory read access interface 382 for interfacing with SRAM bank 322a. As discussed above, SRAM bank 322a may include single port SRAM devices. Here, SRAM bank 322a may also include a single write data port WDATA[15:0]. Write access sub-engine 338a and SRAM bank 322a together can form memory 375 with multiple write data ports 387a and 387b.

Each write access interface includes a write request processor (e.g., one of write request processors 384a or 384b) and a write data register (e.g., one of write data registers 386a or 386b). The write data register can be a shift-register that can accept a sequential stream of data and store the data in parallel form. In some examples, the write request processor can receive a sequence of write requests and a corresponding sequence of write data elements from a write access requester device for storing the write data elements at state buffer 322. For example, write request processor 364a may receive a sequence of write requests from post-processor 328 together with a corresponding sequence of data elements of an convolution output array (e.g., $O_{0,0}{}^0$, $O_{0,1}{}^0$, $O_{0,2}{}^0$, etc.), or subsamples of these data elements, to be stored at state buffer 322. Write request processor 384b may also receive a sequence of write requests from activation engine 328b, and another corresponding sequence of data elements of the convolution output array (e.g., $O_{0,5}{}^0$, $O_{0,6}{}^0$, $O_{0,7}{}^0$, etc.), or subsamples of these data elements, to be stored at state buffer 322.

In some examples, the write request processor can accumulate a pre-determined number of write requests (and the corresponding write addresses and write data elements) for a write access requester device, and then initiate a single write operation at state buffer 322 when the pre-determined number of write requests has been accumulated. The pre-determined number can be based on, for example, a size of a write data element to be stored for each write request, and a size of a write data element to be stored into SRAM bank 322a in a single write operation. For example, in a case where a write data element for a write request has a size of 1 byte, and SRAM bank 322a can store 16 bytes of write data element for each write operation (e.g., limited by the input data bus width), the write request processor can buffer up to 16 write requests and the corresponding write addresses and write data elements.

In some examples, the write request processor may also receive a write request from each write access requester device, or from state buffer access controller 340 on behalf of each write access requester device. The write request processor may also receive, from state buffer access controller 340 and with the write request, the write data elements to be stored in SRAM bank 322a.

After accumulating the pre-determined number of write data elements, the write request processor can signal memory write interface 382 to perform a single write operation at SRAM bank 322a to store the write data elements (e.g., 16 convolution output array elements, etc.) at a first write address provided by the requester device. SRAM bank 322a can then store the write data elements. In the example of FIG. 3E, write request processor 384a can accumulate 16 write requests, write addresses, and one-byte data elements D[0], D[1], D[2], ... D[15] (received via write data port 387a) from post-processor 328, and then transmit a write enable signal, the starting write address, and 16-byte data elements D[15:0] to SRAM bank 322a (via memory write access interface 382), which then stores the 16-byte data D[15:0]. Moreover, write request processor 384b can accumulate 16 write requests, write addresses, and one-byte data elements E[0], E[1], E[2], ... E[15] (received via write data port 387b) from post-processor 328, and then transmit a write enable signal, the starting write address, and 16-byte data elements E[15:0] to SRAM bank 322a (via memory read access interface 382), which then stores the 16-byte data E[15:0]. The data elements D[0], D[1], D[2], ... D[15] and E[0], E[1], E[2], ... E[15] may correspond to different columns of computing engine 324 and/or different processing nodes of a neural network layer, and can represent the results of pooling operations (e.g., by pooling engine 328a) or activation processing (e.g., by activation engine 328b).

Figure 3F:
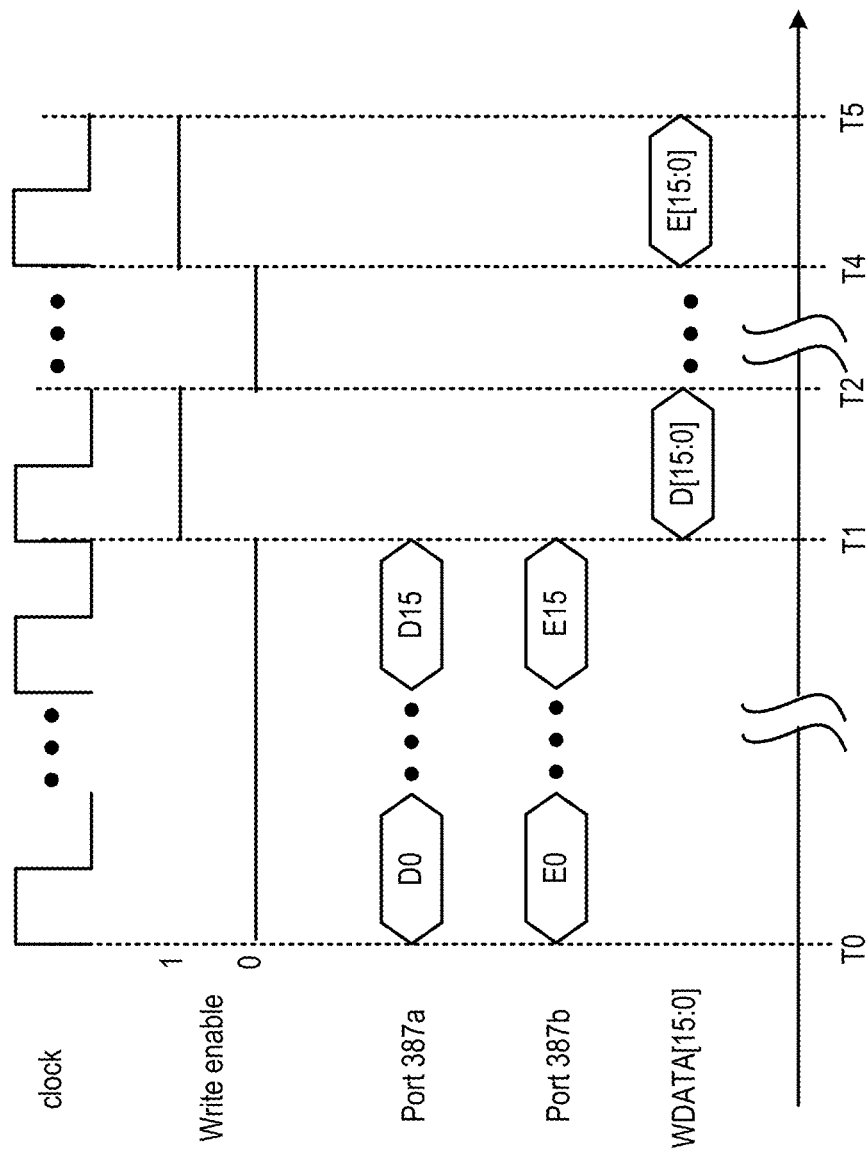

FIG. 3F provides an illustrative example of the operations of write sub-engine 438a. Between times T0 to T1, write request processor 384a may receive 16 one-byte data elements D[0], D[1], ... D[15] and 16 one-byte data elements E[0], E[1], E[15] sequentially from post-processor 328 in 16 consecutive clock cycles. The data elements are to be stored at SRAM bank 322a. Between times T1 and T2, write request processor 384a may transmit a write enable signal to memory write interface 382, which causes memory write interface 382 to perform a write operation to store a 16-byte data element (D[15:0]) at SRAM bank 322a in one clock cycle between times T1 and T2. Between times T3 to T4, write request processor 384b may transmit a write enable signal to memory write interface 382 at time T4 to cause memory write interface 382 to perform a write operation to store the 16-byte data element (E[15:0]) at SRAM bank 322a in one clock cycle between times T3 and T4. With the arrangements of FIG. 3F, post-processor 328 can transmit a larger number of output data sets in parallel to SRAM bank 322a, which allows post-processor 328 to generate more output data sets within a time period, which can reduce the total time needed to complete the different batches of the neural network computations. As a result, the performance of neural network processor 302 can be improved. Moreover, by reducing the access time of SRAM bank 322a, power consumption due to memory access can be reduced as well.

In some examples, state buffer access controller 340 can schedule the performances of the read operations and write operations by, respectively, read access engine 336 and write access engine 338. The scheduling can be based on data dependency. For example, based on a sequence of operations among state buffer 322, pooling engine 328a, and activation engine 328b to generate output data for a neural network layer computation, state buffer access controller 340 can schedule a read operation for computing engine 324 first (e.g., to obtain the input data sets for computations), followed by a write operation by pooling engine 328a to store the outputs (or the subsamples of the outputs) of computing engine 324, followed by a read operation for activation engine 328b to obtain the outputs (or the subsamples of the outputs) of computing engine 324 stored by pooling engine 328a, and followed by a write operation by activation engine 328b to store the results of the activation function processing.

On the other hand, in a case where there is no data dependency, state buffer access controller 340 can interleave read and write operations for different access requester devices. For example, state buffer access controller 340 can control read access sub-engine 336a to perform a read operation at state buffer 322 to obtain a new set of weights for the next neural network layer computations. That read operation can be scheduled to be performed between the read or write operations performed by post-processor 328, based on an assumption that post-processor 328 does not update the weights. Further, state buffer access controller 340 can also control a write access engine to obtain the new weights from DMA controller 316 (and from memory 312) and perform a write operation to store the new weights at state buffer 322. The write operation can also be scheduled to be performed between the read or write operations performed by post-processor 328, based on an assumption that post-processor 328 does not update the new weights.

Figure 4:
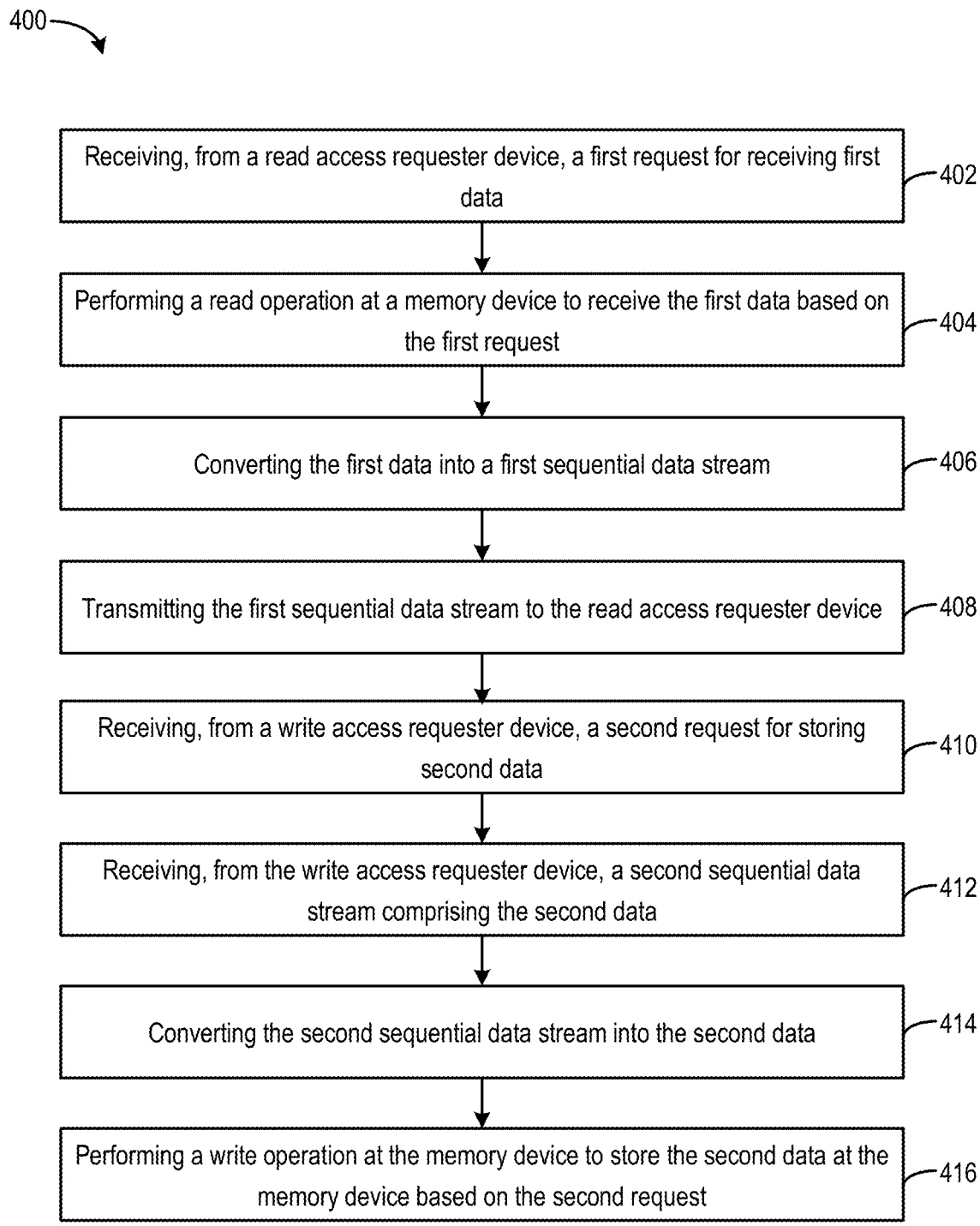
FIG. 4 illustrates an example flow diagram of performing multi-layer neural network processing of multiple sets of data, according to certain aspects of the present disclosure.

FIG. 4 illustrates an example flow diagram of a process 400 for operating an array of computing elements. Process 400 may be implemented by, for example, read access engine 336 and write access engine 338 to support neural network computations at an integrated circuit (e.g., neural network processor 302). The computations may include, for example, computations for a deep neural network (DNN), a convolutional neural network (CNN), etc.

At operation 402, read access engine 336 may receive, from a read access requester device, a first request for receiving first data. The read access requester device may include, for example, computing engine 324, activation function engine 328b, etc. The first data may include, for example, pixel data, convolution output, etc. The first request may include multiple requests sequentially received over multiple clock cycles, with each of the multiple request being for reading a data element of the first data. The first request may also include (or being associated with) a read address.

At operation 404, read access engine 336 may perform a read operation at a memory device (e.g., state buffer 322) to receive the first data based on the first request. Read access engine 336 may transmit a read enable signal and the read address to state buffer 322 to receive the first data in a single clock cycle. Read access engine 336 can store the first data in a shift register (e.g., read data register 376a).

At operation 406, read access engine 336 can convert the first data into a first sequential data stream. The conversion can be performed by the shift register. As each data element of the first sequential data stream is being generated (e.g., by the shifting action of the shift register), the first sequential data stream can also be transmitted to the read access requester device over multiple clock cycles, with one data element being transmitted per clock cycle, at operation 408.

At operation 410, write access engine 338 may receive, from a write access requester device (e.g., pooling engine 328a, activation function engine 328b, etc.), a second request for storing second data. The second data to be stored may include, for example, output of pooling engine 328a, output of activation function engine 328b, etc. The second request may include multiple requests transmitted sequentially over multiple clock cycles. The second request may also include (or be associated with) a write address.

At operation 412, write access engine 338 may receive, from the write access requester device, a second sequential data stream comprising the second data. The second sequential data stream may include data elements of the second data transmitted sequentially over multiple clock cycles, with one data element being received per clock cycle, at operation 412.

At operation 414, write access engine 338 may convert the second sequential data stream into the second data. The conversion can be performed by the shifting action of a shift register (e.g., write data register 386a).

At operation 416, write access engine 338 may perform a write operation at the memory device (e.g., state buffer 322) to store the second data based on the second request. Write access engine 338 may transmit a write enable signal, the write address, as well as the second data converted at operation 416 to state buffer 322 to store the second data in a single clock cycle.

Figure 5:
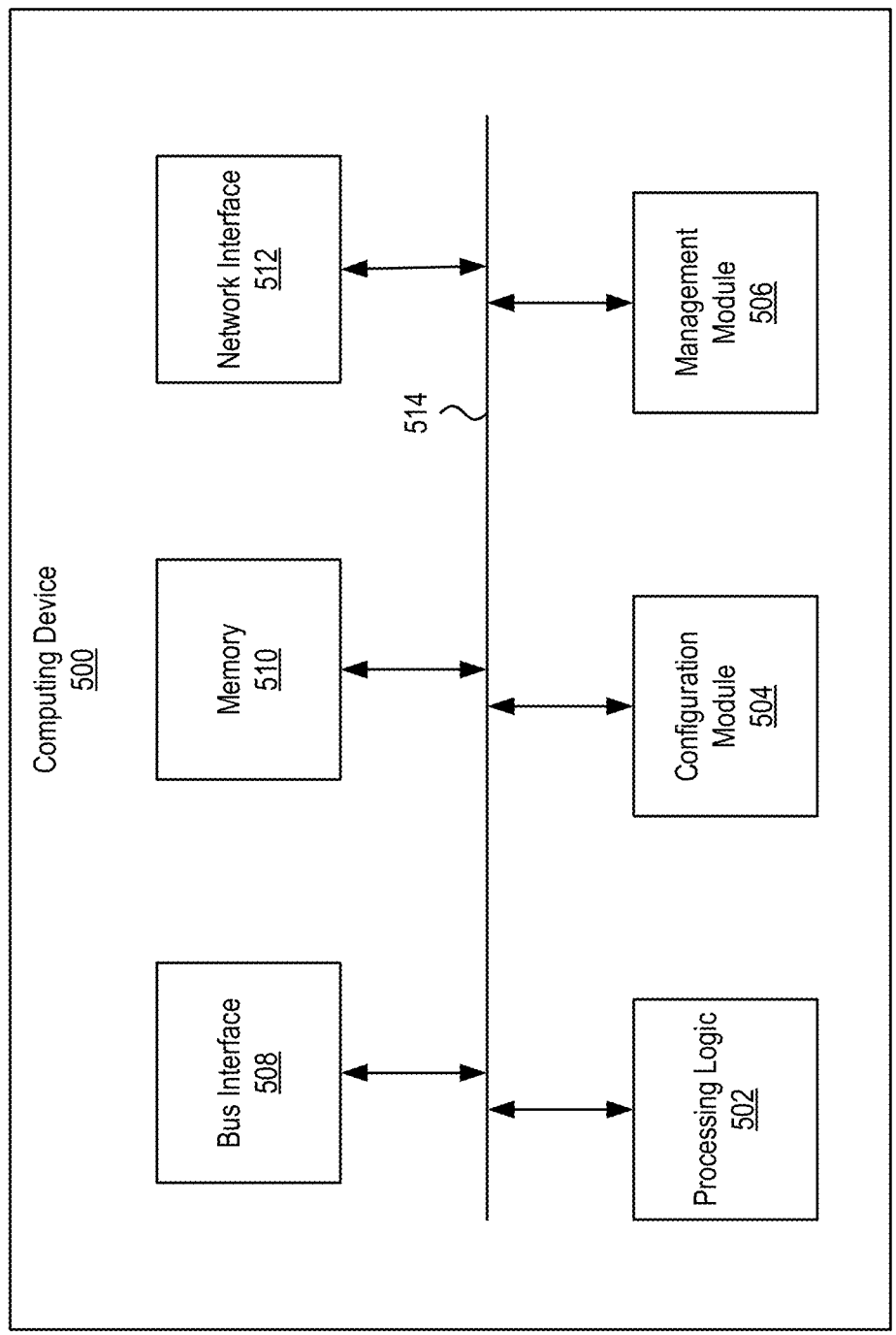
FIG. 5 illustrates an example of a computing device, according to certain aspects of the disclosure.

FIG. 5 illustrates an example of a computing device 500. Functionality and/or several components of the computing device 500 may be used without limitation with other embodiments disclosed elsewhere in this disclosure, without limitations. A computing device 500 may perform computations to facilitate processing of a task. As an illustrative example, computing device 500 can be part of a server in a multi-tenant compute service system. Various hardware and software resources of computing device 500 (e.g., the hardware and software resources associated with provision of an image recognition service) can be allocated to a client upon request.

In one example, the computing device 500 may include processing logic 502, a bus interface module 508, memory 510, and a network interface module 512. These modules may be hardware modules, software modules, or a combination of hardware and software. In certain instances, modules may be interchangeably used with components or engines, without deviating from the scope of the disclosure. The computing device 500 may include additional modules, not illustrated here. In some implementations, the computing device 500 may include fewer modules. In some implementations, one or more of the modules may be combined into one module. One or more of the modules may be in communication with each other over a communication channel 514. The communication channel 514 may include one or more busses, meshes, matrices, fabrics, a combination of these communication channels, or some other suitable communication channel.

The processing logic 702 may include one or more integrated circuits, which may include application specific integrated circuits (ASICs), field programmable gate arrays (FPGAs), systems-on-chip (SoCs), network processing units (NPUs), processors configured to execute instructions or any other circuitry configured to perform logical arithmetic and floating point operations. Examples of processors that may be included in the processing logic 702 may include processors developed by ARM®, MIPS®, AMD®, Intel®, Qualcomm®, and the like. In certain implementations, processors may include multiple processing cores, wherein each processing core may be configured to execute instructions independently of the other processing cores. Furthermore, in certain implementations, each processor or processing core may implement multiple processing threads executing instructions on the same processor or processing core, while maintaining logical separation between the multiple processing threads. Such processing threads executing on the processor or processing core may be exposed to software as separate logical processors or processing cores. In some implementations, multiple processors, processing cores or processing threads executing on the same core may share certain resources, such as for example busses, level 1 (L1) caches, and/or level 2 (L2) caches. The instructions executed by the processing logic 502 may be stored on a computer-readable storage medium, for example, in the form of a computer program. The computer-readable storage medium may be non-transitory. In some cases, the computer-readable medium may be part of the memory 510. Processing logic 502 may also include hardware circuities for performing artificial neural network computation including, for example, neural network processor 302, etc.

The access to processing logic 502 can be granted to a client to provide the personal assistant service requested by the client. For example, computing device 500 may host a virtual machine, on which an image recognition software application can be executed. The image recognition software application, upon execution, may access processing logic 502 to predict, for example, an object included in an image. As another example, access to processing logic 502 can also be granted as part of bare-metal instance, in which an image recognition software application executing on a client device (e.g., a remote computer, a smart phone, etc.) can directly access processing logic 502 to perform the recognition of an image.

The memory 510 may include either volatile or non-volatile, or both volatile and non-volatile types of memory. The memory 510 may, for example, include random access memory (RAM), read only memory (ROM), Electrically Erasable Programmable Read-Only Memory (EEPROM), flash memory, and/or some other suitable storage media. In some cases, some or all of the memory 510 may be internal to the computing device 500, while in other cases some or all of the memory may be external to the computing device 500. The memory 510 may store an operating system comprising executable instructions that, when executed by the processing logic 702, provides the execution environment for executing instructions providing networking functionality for the computing device 500. The memory 510 may also store, for example, software applications for performing artificial neural network computation. For example, memory 510 may store software routines related to the computations of equations above. In a case where processing logic 502 is in the form of FPGA, memory 510 may store netlists data representing various logic circuit components of processing logic 502.

The bus interface module 508 may enable communication with external entities, such as a host device and/or other components in a computing system, over an external communication medium. The bus interface module 508 may include a physical interface for connecting to a cable, socket, port, or other connection to the external communication medium. The bus interface module 708 may further include hardware and/or software to manage incoming and outgoing transactions. The bus interface module 708 may implement a local bus protocol, such as Peripheral Component Interconnect (PCI) based protocols, Non-Volatile Memory Express (NVMe), Advanced Host Controller Interface (AHCI), Small Computer System Interface (SCSI), Serial Attached SCSI (SAS), Serial AT Attachment (SATA), Parallel ATA (PATA), some other standard bus protocol, or a proprietary bus protocol. The bus interface module 708 may include the physical layer for any of these bus protocols, including a connector, power management, and error handling, among other things. In some implementations, the computing device 500 may include multiple bus interface modules for communicating with multiple external entities. These multiple bus interface modules may implement the same local bus protocol, different local bus protocols, or a combination of the same and different bus protocols.

The network interface module 512 may include hardware and/or software for communicating with a network. This network interface module 512 may, for example, include physical connectors or physical ports for wired connection to a network, and/or antennas for wireless communication to a network. The network interface module 512 may further include hardware and/or software configured to implement a network protocol stack. The network interface module 512 may communicate with the network using a network protocol, such as for example TCP/IP, Infiniband, RoCE, Institute of Electrical and Electronics Engineers (IEEE) 802.11 wireless protocols, User Datagram Protocol (UDP), Asynchronous Transfer Mode (ATM), token ring, frame relay, High Level Data Link Control (HDLC), Fiber Distributed Data Interface (FDDI), and/or Point-to-Point Protocol (PPP), among others. In some implementations, the computing device 900 may include multiple network interface modules, each configured to communicate with a different network. For example, in these implementations, the computing device 500 may include a network interface module for communicating with a wired Ethernet network, a wireless 802.11 network, a cellular network, an Infiniband network, etc. In some embodiments, computing device 500 may receive a set of parameters, such as the aforementioned weight vectors for generation of forget gate factor, input factor, output factor, etc. from a server through network interface module 512.

The various components and modules of the computing device 500, described above, may be implemented as discrete components, as a System on a Chip (SoC), as an ASIC, as an NPU, as an FPGA, or any combination thereof. In some embodiments, the SoC or other component may be communicatively coupled to another computing system to provide various services such as traffic monitoring, traffic shaping, computing, etc. In some embodiments of the technology, the SoC or other component may include multiple subsystems as disclosed herein.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in FIG. 5 and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. An integrated circuit, comprising:
a first port and a second port; and
a read access engine configured to:
receive, from a first access requester device, a first read request to fetch first data stored at a memory device;
receive, from a second access requester device, a second read request to fetch second data stored at the memory device;
provide, via the first port, a sequential access of a plurality of portions of the first data to the first access requester device by:
receiving the plurality of portions of the first data from the memory device during a first single clock cycle and outputting the plurality of portions of the first data to the first access requester device during multiple clock cycles;
provide, via the second port, a sequential access of a plurality of portions of the second data to the second access requester device by:
receiving the plurality of portions of the second data from the memory device during a second single clock cycle and outputting the plurality of portions of the second data to the first access requester device during the multiple clock cycles, wherein the second single clock cycle is after the first single clock cycle, and wherein the multiple clock cycles are after the second single clock cycle.

2. The integrated circuit of claim 1,
wherein the read access engine is configured to provide the sequential access of the plurality of portions of the first data to the first access requester device based on:
fetching the plurality of portions of the first data in parallel form from the memory device; and
outputting, via the first port, the plurality of portions of the first data sequentially to the first access requester device.

3. The integrated circuit of claim 2, wherein the read access engine is configured to receive a plurality of read requests, each of the plurality of read requests corresponding to a respective portion of the plurality of portions of the first data; and
wherein the read access engine further comprises a read shift-register;
wherein the read access engine is configured to:
based on receiving the plurality of read requests, fetch the plurality of portions of the first data in parallel form in a single read operation from the memory device to the read shift-register;
store the plurality of portions of the first data fetched from the memory device at the read shift-register; and
control the read shift-register to output the plurality of portions of the first data sequentially to the first access requester device.

4. The integrated circuit of claim 3, wherein the read access engine is configured to read the plurality of portions of the first data in parallel form in the single read operation from the memory device based on determining that a pre-determined number of the plurality of read requests is received; and
wherein the pre-determined number is based on a size of each portion of the first data and a size of the first data fetched from the memory device in a single read operation.

5. The integrated circuit of claim 1, wherein the read access engine is configured to provide the sequential access of the plurality of portions of the second data to the second access requester device based on:
fetching the plurality of portions of the second data in parallel form from the memory device; and
outputting, via the second port, the plurality of portions of the second data sequentially to the second access requester device.

6. The integrated circuit of claim 1, wherein:
the integrated circuit further comprises a write access engine; and
the write access engine is configured to:
receive a write access request from the second access requester device;
receive, via the second port, a plurality of portions of third data sequentially from the second access requester device; and
based on receiving the write access request, store the plurality of portions of the third data in parallel form at the memory device.

7. The integrated circuit of claim 1, wherein
the memory device is a single port static random access memory (SRAM).

8. A method, comprising:
receiving, from a first access requester device, a first read request to fetch first data stored at a memory device;
receiving, from a second access requester device, a second read request to fetch second data stored at the memory device;
providing, via a first port, a sequential access of a plurality of portions of the first data to the first access requester device by:
receiving the plurality of portions of the first data from the memory device during a first single clock cycle and outputting the plurality of portions of the first data to the first access requester device during multiple clock cycles;
providing, via a second port, a sequential access of a plurality of portions of the second data to the second access requester device by:
receiving the plurality of portions of the second data from the memory device during a second single clock cycle and outputting the plurality of portions of the second data to the first access requester device during the multiple clock cycles, wherein the second single clock cycle is after the first single clock cycle, and wherein the multiple clock cycles are after the second single clock cycle.

9. The method of claim 8, wherein providing the sequential access of the plurality of portions of the first data to the first access requester device includes:
fetching the plurality of portions of the first data in parallel form from the memory device; and
outputting, via the first port, the plurality of portions of the first data sequentially to the first access requester device.

10. The method of claim 8, wherein providing the sequential access of the plurality of portions of the second data to the second access requester device includes:
   fetching the plurality of portions of the second data in parallel form from the memory device; and
   outputting, via the second port, the plurality of portions of the second data sequentially to the second access requester device.

11. The method of claim 8, wherein the method further comprises:
   receiving, from the first access requester device, a plurality of first read requests, each of the plurality of first read requests corresponding to a respective portion of the plurality of portions of the first data.

12. The method of claim 11, wherein the method further comprises:
   receiving, from the second access requester device, a plurality of second read requests, each of the plurality of second read requests corresponding to a respective portion of the plurality of portions of the second data.

13. An integrated circuit, comprising:
   a first port and a second port; and
   a write access engine configured to:
      receive, from a first access requester device, a first write request to store first data at a memory device;
      receive, from a second access requester device, a second write request to store second data at the memory device;
      provide, via the first port, a sequential access of a plurality of portions of the first data to the first access requester device by:
         receiving the plurality of portions of the first data from the first access requester device during multiple clock cycles and storing the plurality of portions of the first data at the memory device during a first single clock cycle;
      provide, via the second port, a sequential access of a plurality of portions of the second data to the second access requester device by:
         receiving the plurality of portions of the second data from the second access requester device during the multiple clock cycles and storing the plurality of portions of the second data at the memory device during a second single clock cycle, wherein the second single clock cycle is after the first single clock cycle, and wherein the multiple clock cycles are before the first single clock cycle.

14. The integrated circuit of claim 13, wherein the write access engine is configured to provide the sequential access of the plurality of portions of the first data to the first access requester device based on:
   receiving, via the first port, the plurality of portions of the first data sequentially from the first access requester device; and
   storing the plurality of portions of the first data in parallel form at the memory device.

15. The integrated circuit of claim 13, wherein the write access engine is configured to provide the sequential access of the plurality of portions of the second data to the second access requester device based on:
   receiving, via the second port, the plurality of portions of the second data sequentially from the second access requester device; and
   storing the plurality of portions of the second data in parallel form at the memory device.

16. The integrated circuit of claim 13, wherein the memory device is a single port static random access memory (SRAM).

* * * * *